United States Patent
Park et al.

(10) Patent No.: US 7,141,180 B2
(45) Date of Patent: Nov. 28, 2006

(54) ETCHANT FOR WIRE, METHOD OF MANUFACTURING WIRE USING ETCHANT, THIN FILM TRANSISTOR ARRAY PANEL INCLUDING WIRE AND MANUFACTURING METHOD THEREOF

(75) Inventors: Hong-Sick Park, Kyungki-do (KR); Sung-Chul Kang, Kyungki-do (KR); Hong-Je Cho, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 182 days.

(21) Appl. No.: 10/607,316

(22) Filed: Jun. 25, 2003

(65) Prior Publication Data

US 2004/0072444 A1    Apr. 15, 2004

(30) Foreign Application Priority Data

Jun. 25, 2002    (KR) ............................... 2002-35752

(51) Int. Cl.
*C09K 13/00*    (2006.01)
(52) U.S. Cl. .................. 252/79.1; 252/79.2; 252/79.4; 438/745
(58) Field of Classification Search ............... 252/79.1, 252/79.2, 79.4
See application file for complete search history.

(56) References Cited

U.S. PATENT DOCUMENTS

| 5,219,484 A | * | 6/1993 | Krulik ........................ 252/79.2 |
| 6,592,742 B1 | * | 7/2003 | Sun et al. .................... 205/651 |
| 6,740,589 B1 | * | 5/2004 | Shimazu et al. ............ 438/691 |

* cited by examiner

*Primary Examiner*—Nadine Norton
*Assistant Examiner*—Binh X. Tran
(74) *Attorney, Agent, or Firm*—MacPherson Kwok Chen & Heid LLP; Tom Chen

(57) ABSTRACT

A method of manufacturing a TFT array panel according to the present invention forms a gate wire on an insulating substrate. The gate wire includes a plurality of gate lines and a plurality of gate electrodes connected to the gate lines. A semiconductor layer and a gate insulating layer are sequentially formed and a data wire is formed thereon. The data wire includes a plurality of data lines intersecting the gate lines, a plurality of source electrodes connected to the data lines and placed close to the gate electrodes, and a plurality of drain electrodes opposite the source electrodes with respect to the gate electrodes. A passivation layer is deposited and patterned to form a plurality of contact holes exposing the drain electrodes at least. A conductive layer made of Ag or Ag alloy is deposited on the passivation layer, and is patterned using an etchant containing ferric nitrate, nitric acid, acetic acid, hexamethylenetetramine and deionized water to form a plurality of reflective films electrically connected to the drain electrodes.

1 Claim, 34 Drawing Sheets

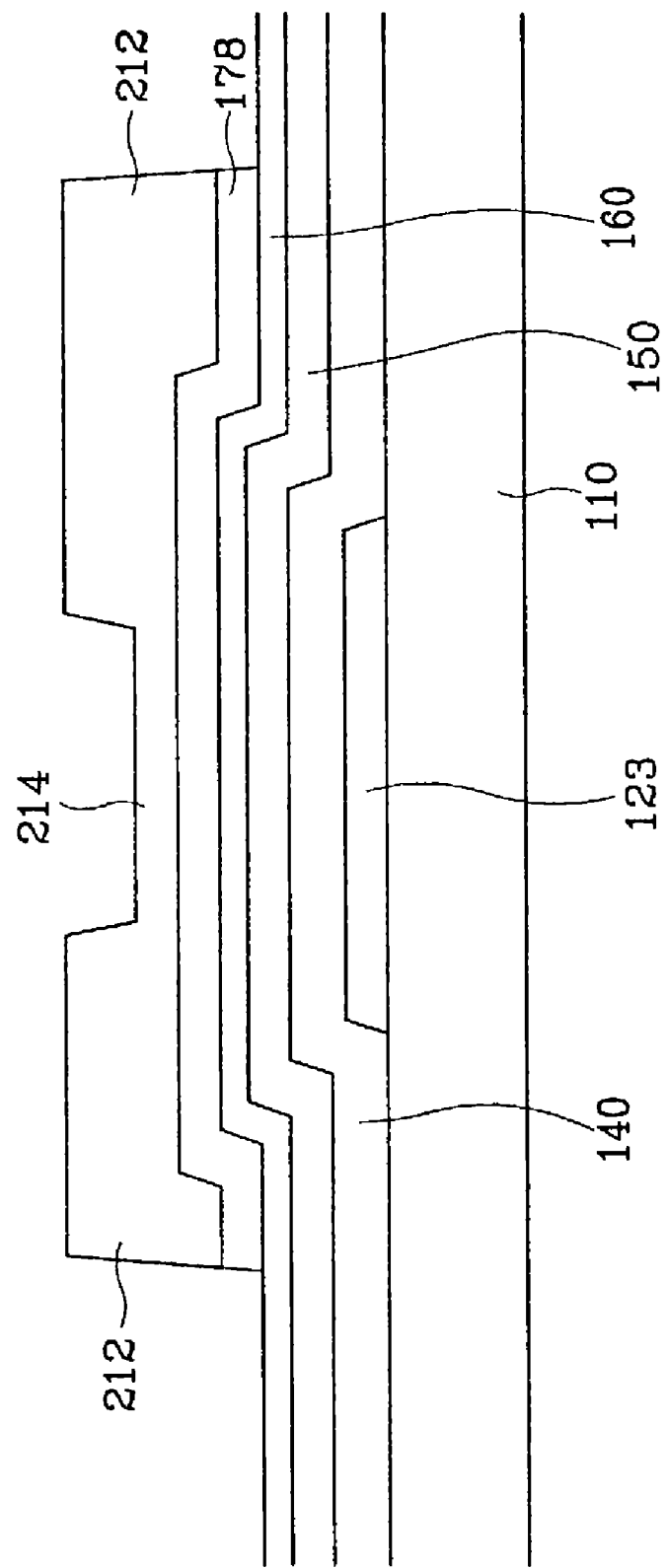

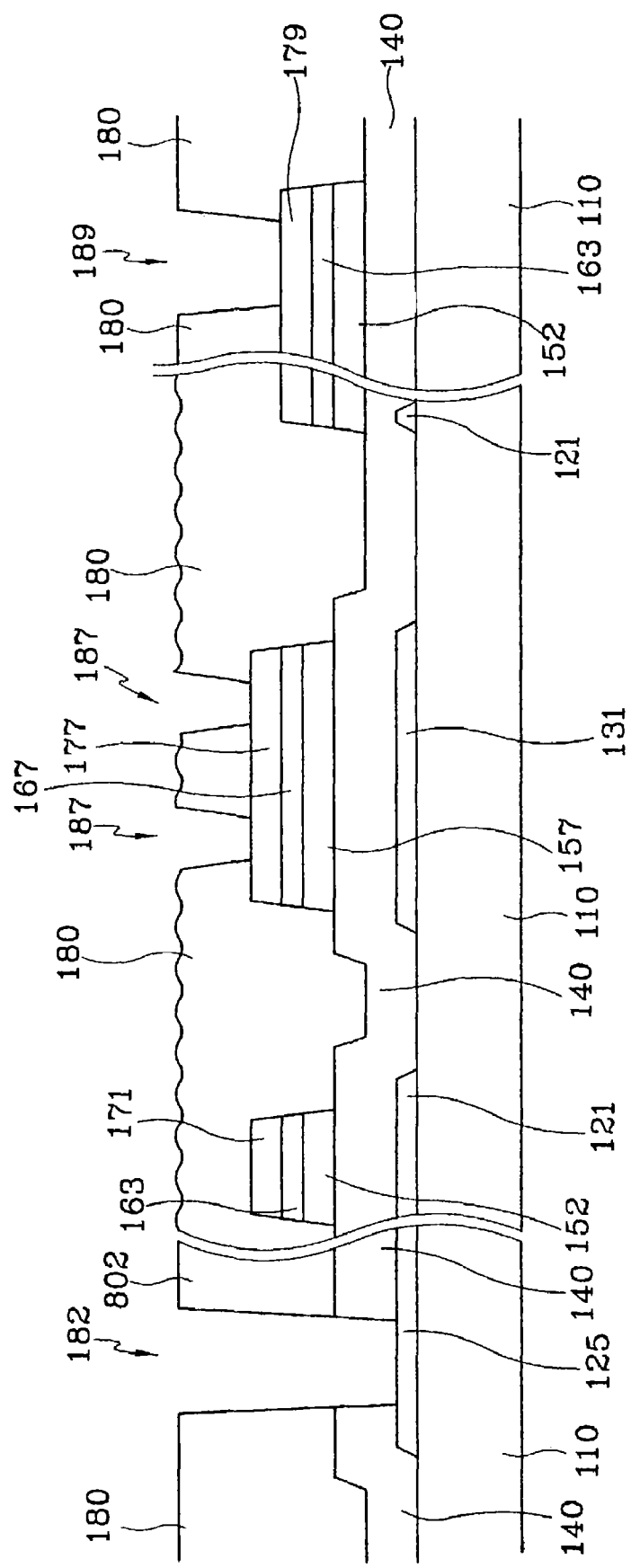

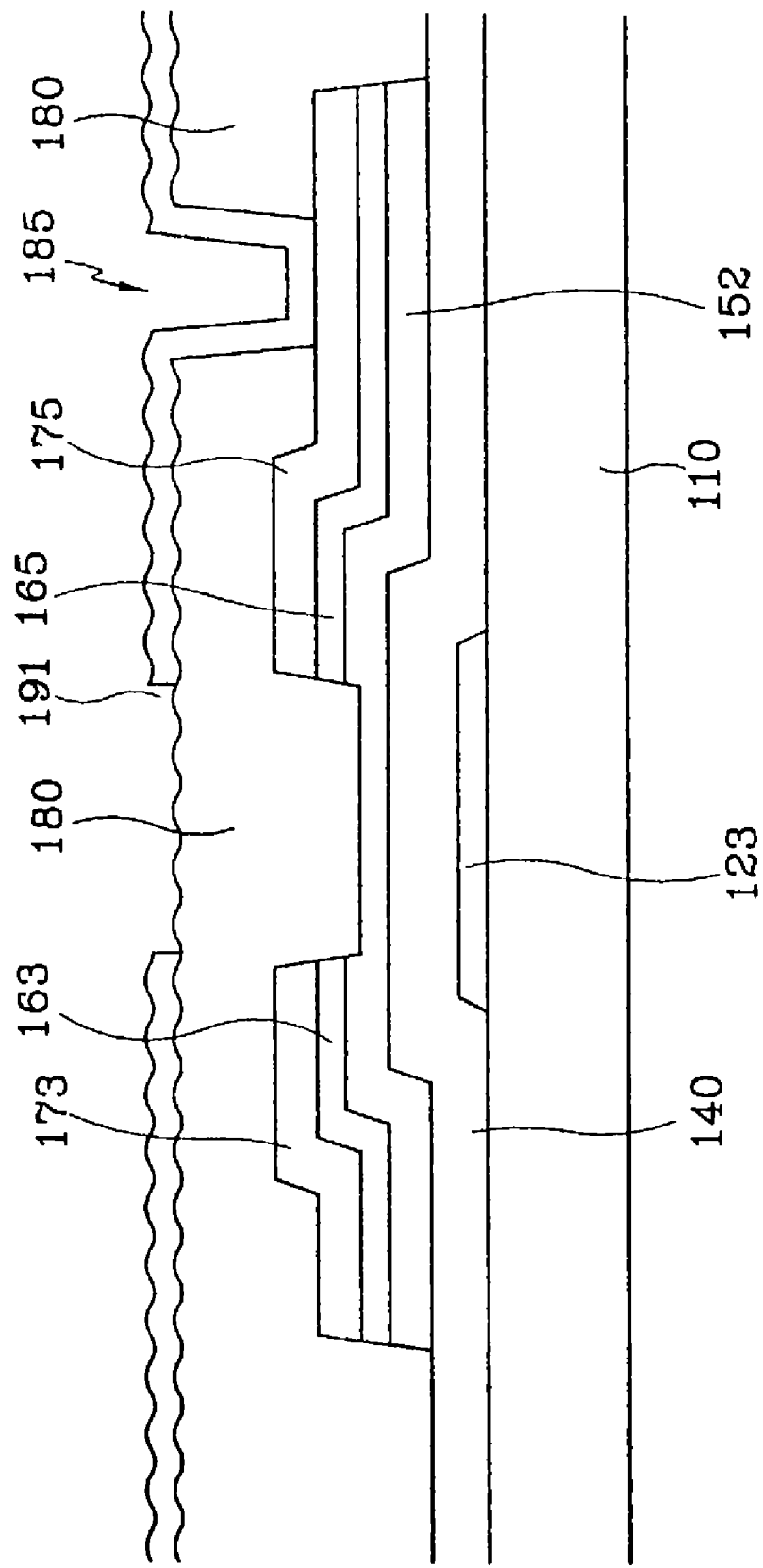

ETCHANT FOR WIRE, METHOD OF MANUFACTURING WIRE USING ETCHANT, THIN FILM TRANSISTOR ARRAY PANEL INCLUDING WIRE AND MANUFACTURING METHOD THEREOF

BACKGROUND OF THE INVENTION (a) Field of the Invention

The present invention relates to an etchant for a wire, a manufacturing method using an etchant, a thin film transistor array panel including a wire and a manufacturing method thereof.

(b) Description of the Related Art

Generally, a wire for transmitting signals in a semiconductor device or a display device is required to be resistant against signal delay.

One of a method of preventing signal delay is to use conductive material having low resistivity such as Ag having the lowest resistivity. However, there is a disadvantage that Ag and Ag alloy are hard to be patterned by a photolithography process using a mask.

A liquid crystal display ("LCD"), which is one of the most widely used plat panel displays, includes two panels having a plurality of electrodes and a liquid crystal layer interposed therebetween. The LCD applies voltages to the electrodes to rearrange the liquid crystal molecules, thereby adjusting the transmitted amount of incident light.

An LCD including electrodes on respective panels and thin film transistors ("TFTs") switching the voltages applied to the electrodes is mostly used among various kinds of LCDs. The TFTs are typically provided on one of the two panels.

LCDs are classified into three types, a transmissive type, a reflective type, and a transflective type. The transmissive LCD displays images by passing light emitted from a specific light source called a backlight through a transparent film, which is a pixel electrode made of transparent conductive material. The reflective LCD displays images by reflecting external light such as natural light using a reflecting film, which is a pixel electrode made of reflective conductive material. The transflective LCD uses both a reflective film and a transparent film as a pixel electrode.

A reflective LCD or the transflective LCD in reflective mode without using the specific light source has an advantage of small power consumption while it has a disadvantage of poor image quality because it only uses light from the reflecting film, image quality is low. In order to overcome the disadvantage, the reflective film is preferably made of Ag, Ag alloy, Al or Al alloy having a high reflectance.

Ag and Ag alloy has a reflectance higher than Al and Al alloy by about 15% and increases visibility, while they are hard to be patterned using typical photolithography. As a result, Ag and Ag alloy are not in practical use as a reflective film.

Meanwhile, a panel provided with wires or TFTs is generally manufactured by photolithography using masks. In this regard, it is preferable that the number of masks is reduced in order to decrease production costs.

SUMMARY OF THE INVENTION

A motivation for the present invention is to provide an etchant for a wire capable of finely patterning the wire and a manufacturing method using the etchant.

Another motivation for the present invention is to provide a thin film transistor array panel and a manufacturing method thereof capable of finely patterning a reflecting film.

Still another motivation for the present invention is to simplify a manufacturing process of a thin film transistor array panel.

A method of manufacturing a wire and a thin film transistor array panel including the same according to the present invention patterns a conductive layer made of Ag or Ag alloy using an etchant for a wire, which includes ferric nitrate $Fe(NO_3)_3$, nitric acid, acetic acid, hexamethylenetetramine $C_6H_{12}N_4$ and deionized water.

The etchant for a wire preferably includes the ferric nitrate in a range of 1–5%, the nitric acid in a range of 1–5%, the acetic acid in a range of 5–20%, the hexamethylenetetramine in a range of 0.05–1% and the ionized water of the remainder. The Ag alloy is a binary alloy or a tertiary alloy including Ag as a base material and at least one conductive material selected from the group consisting of Pd, Cu, Mg, Al, Li, Pu, Np, Ce, Eu, Pr, Ca, Nb, Nd and Sm in a range of 0.01–20 atomic %.

The etchant for a wire and a manufacturing method of a wire are applicable to a thin film transistor array panel and a manufacturing method thereof.

According to a method of manufacturing a thin film transistor array panel according to the present invention, a gate wire including a gate line and a gate electrode connected to the gate line is first formed on an insulating substrate. A gate insulating layer and a semiconductor layer are deposited and a data wire including a data line intersecting the gate line, a source electrode connected to the data line and placed close to the gate electrode, and a drain electrode opposite the source electrode with respect to the gate electrode is formed. A passivation layer is deposited and patterned to for a first contact hole exposing the drain electrode at least. A conductive layer of Ag or Ag alloy is deposited and patterned using an etchant including ferric nitrate, nitric acid, acetic acid, hexamethylenetetramine and deionized water to form a reflective film electrically connected to the drain electrode through the first contact hole.

The conductive layer preferably has a thickness in a range of 1,000–3,000 Å or 300–600 Å, and the passivation layer preferably includes a photosensitive organic insulator.

The gate wire may further include a gate pad receiving a scan signal from an external device and transmitting the scan signal to the gate line, and the data wire may further include a data pad receiving an image signal from the external device and transmitting the image signal to the data line. The passivation layer has a second contact hole exposing the data pad and the passivation layer and the gate insulating layer have a third contact hole exposing the gate pad. A subsidiary gate pad and a subsidiary data pad may be formed on the same layer as the reflective film. The subsidiary gate pad and the subsidiary data pad are electrically connected to the gate pad and the data pad through the second the third contact holes, respectively.

The method may further include depositing a transparent conductive film under the reflective film and the transparent conductive film is preferably made of IZO (indium zinc oxide). In addition, the reflective film preferably has a transmitting window exposing the transparent film in a pixel area.

BRIEF DESCRIPTION OF THE DRAWINGS

FIGS. 14A, 15A and 16A and FIGS. 14B, 15B and 16B are sectional views of the TFT array panel shown in FIG. 13A taken along the line XIIIB–XIIIB' and the line XIIIC–XIIIC', respectively, which sequentially illustrate the steps following the step illustrated in FIG. 13B and FIG. 13C;

FIGS. 17B and 17C are sectional view of the TFT array panel shown in FIG. 17A taken along the line XVIIB–XVIIB' and the line XVIIC–XVIIC', respectively;

FIGS. 18B and 18C are sectional view of the TFT array panel shown in FIG. 18A taken along the line XVIIIB–XVIIIB' and the line XVIIIC–XVIIIC', respectively;

DETAILED DESCRIPTION OF PREFERRED EMBODIMENTS

Figure 1:
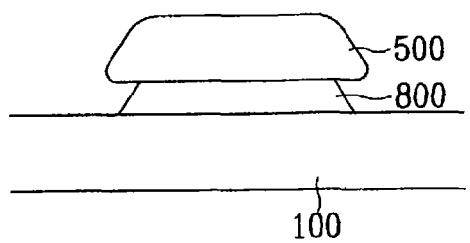
FIG. 1 is a sectional view illustrating a manufacturing method of a wire according to an embodiment of the present invention.

The present invention now will be described more fully hereinafter with reference to the accompanying drawings, in which preferred embodiments of the present invention are shown. This invention may, however, be embodied in many different forms and should not be construed as limited to the embodiments set forth herein.

In the drawings, the thickness of layers and regions are exaggerated for clarity. Like numerals refer to like elements throughout. It will be understood that when an element such as a layer, film, region, substrate or panel is referred to as being "on" another element, it can be directly on the other element or intervening elements may also be present. In contrast, when an element is referred to as being "directly on" another element, there are no intervening elements present. Then, liquid crystal displays according to embodiments of the present invention will be described with reference to the drawings.

Now, manufacturing methods of wires and TFT array panels for LCDs according to embodiments of the present invention is described in detail with reference to drawings.

FIG. 1 is a sectional view illustrating a manufacturing method of a wire according to embodiments of the present invention.

A wire of a semiconductor device, especially a display device, is formed by depositing a thin film for a wire on a substrate 100 and patterning the thin film by means of etching with an etch mask of a photoresist pattern 500. The thin film includes conductive material such as Ag and Ag alloy having the lowest resistivity.

Meanwhile, an etchant for patterning the wire 800 of Ag or Ag alloy in the manufacturing process of the semiconductor device needs to have a fine etching ratio for the wire 800. An inclined angle of the lateral sides of the wire 800 is preferably equal to or less than 90° in consideration of profiles of other films, which is formed later. For this purpose, the manufacturing method of a wire according to an embodiment of the present invention patterns the wire 800 by wet etching, and the etchant preferably contains ferric nitrate $Fe(NO_3)_3$ in a range of 1–5%, nitric acid in a range of 1–5%, acetic acid in a range of 5–20%, hexamethylene-tetramine $C_6H_{12}N_4$ in a range of 0.05–1% and deionized water of the remainder. Ag alloy for the wire 800 includes Ag as a base material and conductive material such as Pd, Cu, Mg, Al, Li, Pu, Np, Ce, Eu, Pr, Ca, Nb, Nd and Sm in a range of 0.01–20 atomic %. Ag alloy for the wire may be binary alloy or tertiary alloy including one or two conductive material.

The manufacturing method according to this embodiment of the present invention is applicable to a manufacturing method of a TFT array panel for an LCD.

First, a TFT array panel for an LCD according to a first embodiment of the present invention will be described in detail with reference to FIGS. 2 and 3.

Figure 2:
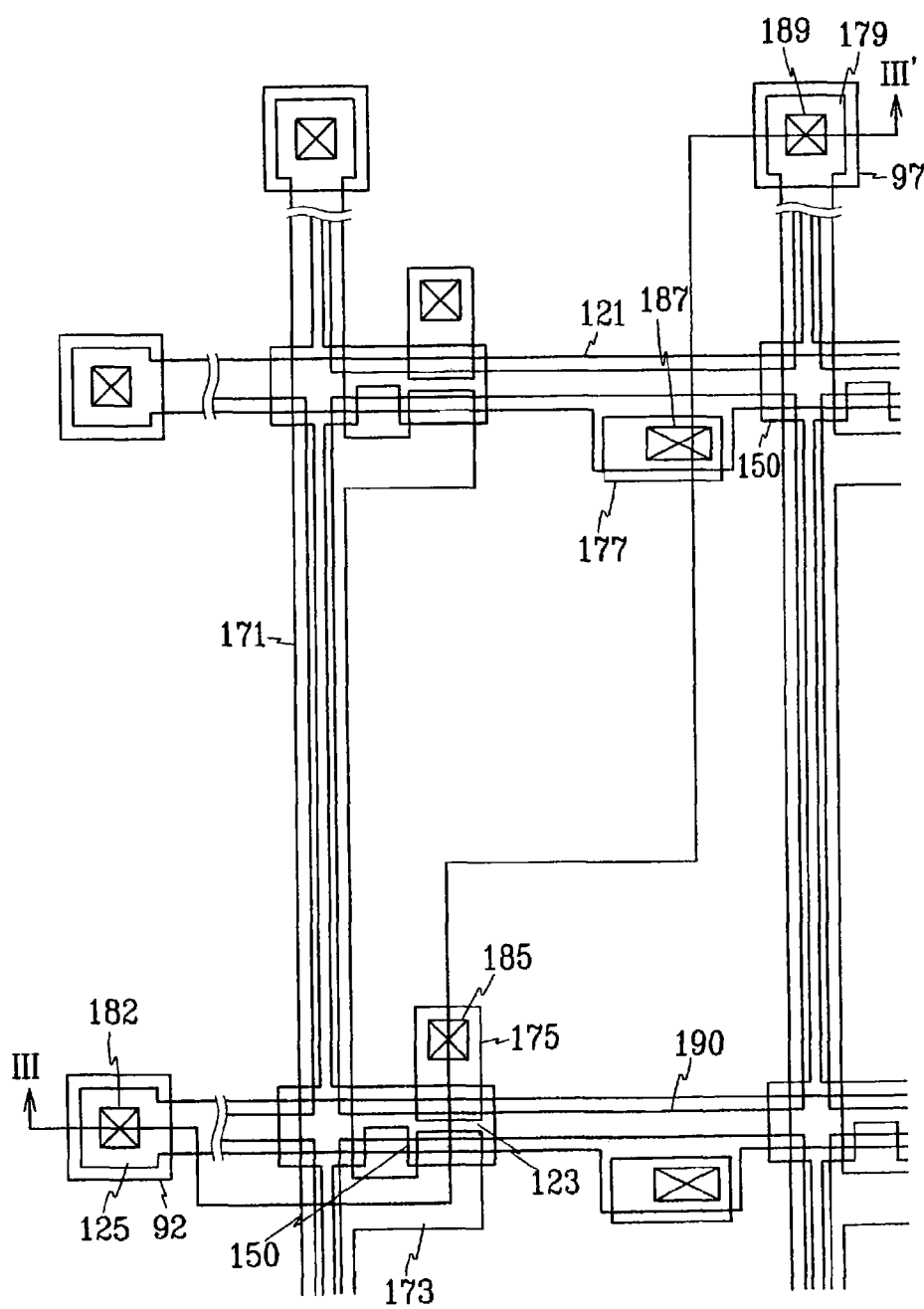
FIG. 2 is a layout view of a TFT array panel for a reflective LCD according to a first embodiment of the present invention, which is manufactured by using a manufacturing method of a wire according to an embodiment of the present invention.
Figure 3:
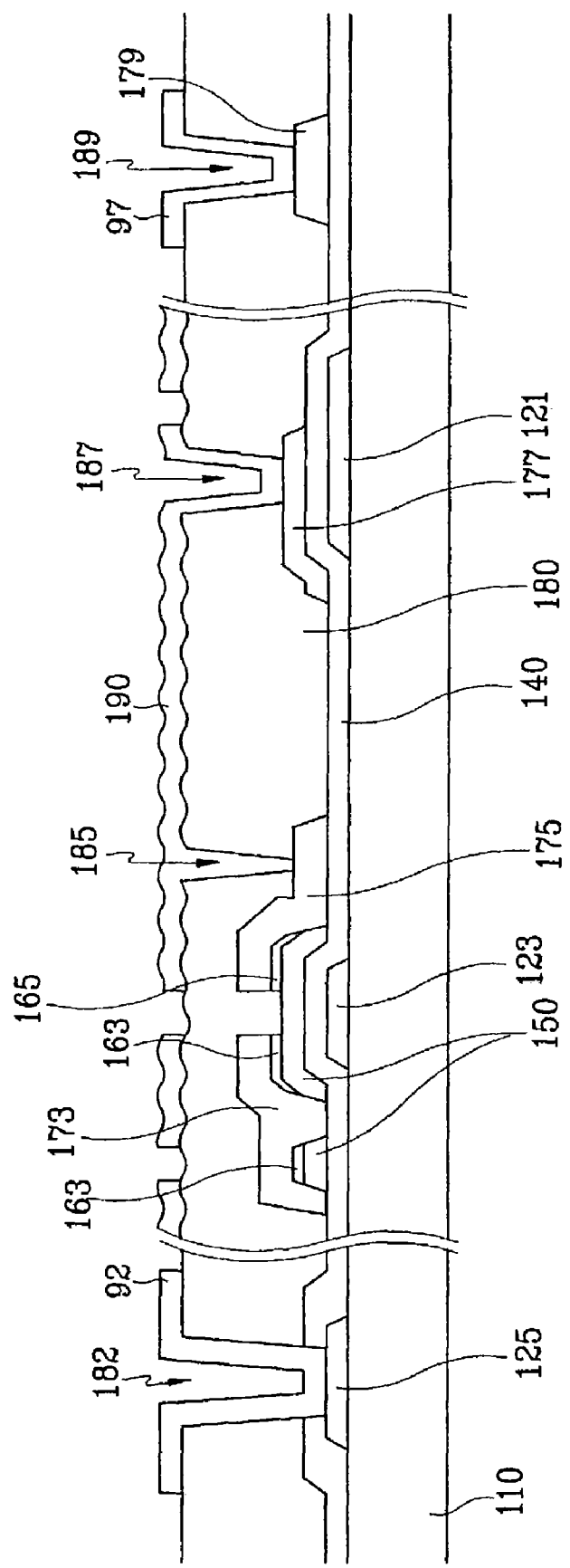
FIG. 3 is a sectional view of the TFT array panel shown in FIG. 2 taken along the line III–III'.

FIG. 2 is a layout view of a TFT array panel for an LCD according to a first embodiment of the present invention, and FIG. 3 is a sectional view of the TFT array panel shown in FIG. 2 taken along the line III—III.

A gate wire is formed on an insulating substrate 110. The gate wire is either a single layer made of Ag, Ag alloy, Al or Al alloy having low resistivity, or a lamination including the single layer. The gate wire includes a plurality of gate lines 121 extending in a transverse direction, a plurality of gate pads 125 connected to one ends of the gate lines 121 to transmit gate signals from an external device to the gate lines 121, and a plurality of gate electrodes 123 of TFTs connected to the gate lines 121. In addition, the gate wire overlaps storage capacitor conductors 177 connected to reflective films 190 to form storage capacitors for enhancing the charge storing capacity of pixels, which is described later.

A gate insulating layer 140 preferably made of SiNx on the substrate 110 covers the gate wire 121, 125 and 123.

A semiconductor layer 150 preferably made of amorphous silicon is formed on the gate insulating layer 140 opposite the gate electrodes 125. An ohmic contact layer 163 and 165 preferably made of silicide or n+ hydrogenated amorphous silicon heavily doped with n type impurities is formed on the semiconductor layer 150.

A data wire is formed on the ohmic contact layer 163 and 165 and the gate insulating layer 140. The data wire includes a conductive layer containing a conductive material having low resistivity such as Ag and Al. The data wire includes a plurality of data lines 171 extending in a longitudinal direction and intersecting the gate lines 121 to form a plurality of pixel areas, a plurality of source electrodes 173 connected to the data lines 171 and extending onto one portion 163 of the ohmic contact layer, a plurality of data pads 179 connected to one ends of the data lines 171 to receive image signals from an external device, and a plurality of drain electrodes 175 formed on the other portion 165 of the ohmic contact layer, located opposite the source electrodes 173 with respect to the gate electrodes 123, and separated from the source electrodes 173. In addition, the data wire includes a plurality of storage capacitor conductors 177, which overlap the gate lines 121 and are connected to the reflective films 190, which are formed later.

A passivation layer 180 is formed on the data wire 171, 173, 175, 177 and 179 and portions of the semiconductor layer 150 which are not covered with the data wire 171, 173, 175, 177 and 179. The passivation layer 180 includes an organic insulating layer made of organic material having an excellent smoothing characteristic and photosensitivity. The surface of the passivation layer 180 has unevenness for maximizing the reflection efficiency of the reflective films 190, which is formed later. The passivation layer 180 may further include an insulating layer made of SiNx, which is preferably positioned under the organic insulating layer to directly cover the semiconductor layer 150. In addition, the organic insulating material is preferably removed from the pad areas provided with the gate pads 125 and the data pads 179, and this configuration is specifically advantageous to a COG (chip on glass) type LCD including gate driving ICs and data driving ICs directly mounted on a TFT array panel.

The passivation layer 180 is provided with a plurality of contact holes 185, 187 and 189 respectively exposing the drain electrodes 175, the storage capacitor conductors 177 and the data pads 179, and the passivation layer 180 and the gate insulating layer 140 have a plurality of contact holes 182 exposing the gate pads 125.

A plurality of reflective films 190 are formed on the passivation layer 180 and located in the pixel areas. The reflective films 190 are electrically connected to the drain electrodes 175 through the contact holes 185 and are preferably made of Ag or Al alloy. Ag alloy for the wire 800 includes Ag as a base material and conductive material such as Pd, Cu, Mg, Al, Li, Pu, Np, Ce, Eu, Pr, Ca, Nb, Nd and Sm in a range of 0.01–20 atomic %. Ag alloy for the wire may be binary alloy or tertiary alloy including one or two conductive material.

Furthermore, a plurality of subsidiary gate pads 92 and a plurality of subsidiary data pads 97 are formed on the passivation layer 180. The subsidiary gate pads 92 and the subsidiary data pads 97 are connected to the gate pads 125 and the data pads 179 through the contact holes 182 and 189, respectively. The subsidiary gate pads 92 and the subsidiary data pads 97 are provided for protecting the gate and the data pads 125 and 179, but are not requisites.

A method of manufacturing a TFT array panel according to an embodiment of the present invention will be now described in detail with reference to FIGS. 4A to 7B as well as FIGS. 2 and 3.

Figure 4A:
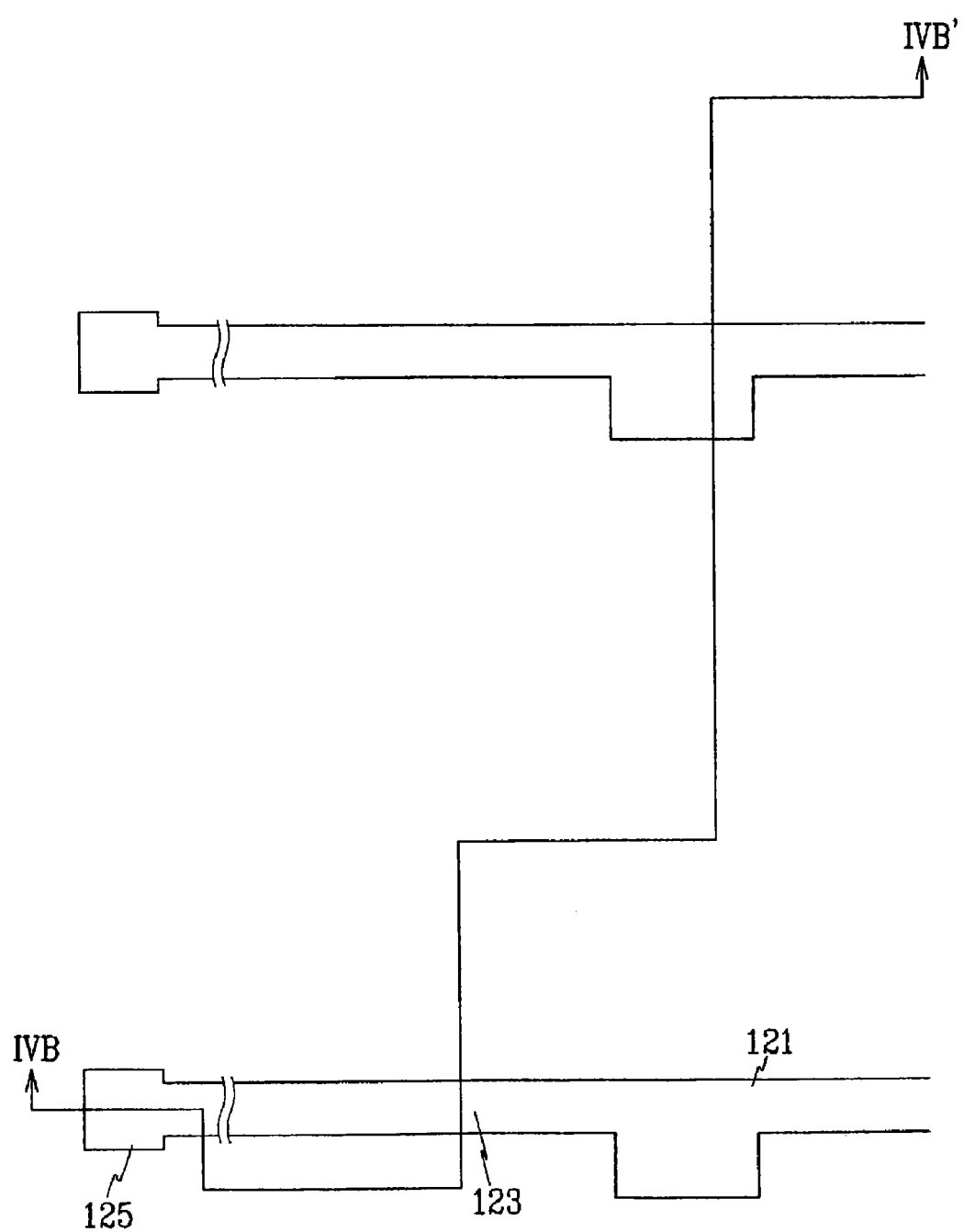
FIGS. 4A, 5A, 6A and 7A are layout views in the intermediate steps of a method of manufacturing a TFT array panel for a reflective LCD according to an embodiment of the present invention.
Figure 4B:
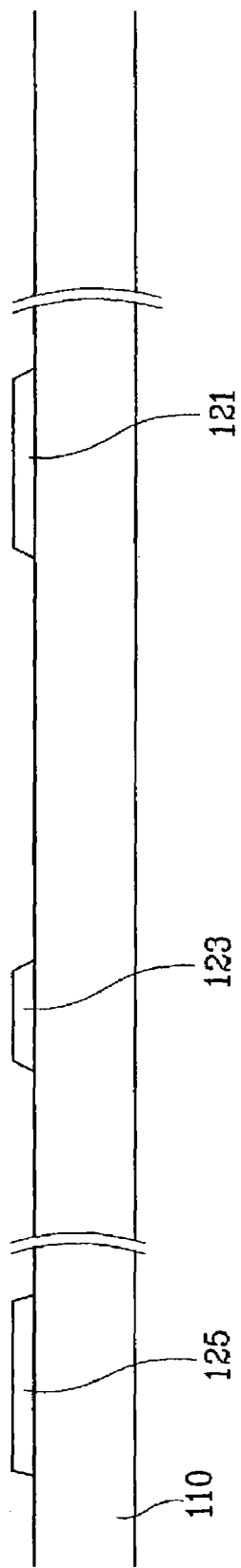
FIG. 4B is a sectional view of the TFT array panel shown in FIG. 4A taken along the line IVB–IVB'.

First, as shown in FIGS. 4A and 4B, a conductive layer having low resistivity is deposited on a substrate 110 and patterned by photo-etching using a mask to form a gate wire extending substantially in a transverse direction. The gate wire includes a plurality of gate lines 121, a plurality of gate electrodes 123, and a plurality of gate pads 125.

Figure 5A:
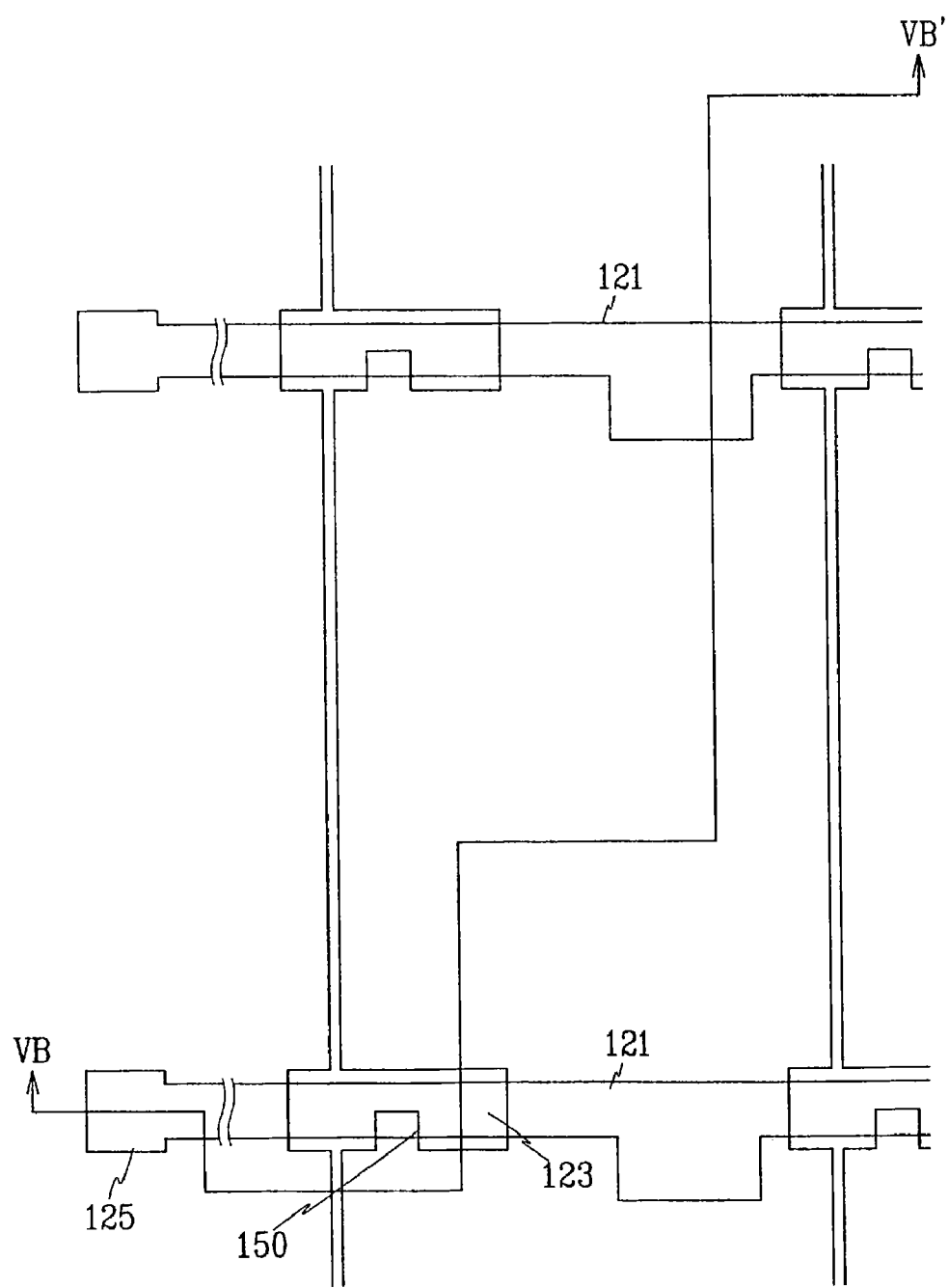
Figure 5B:
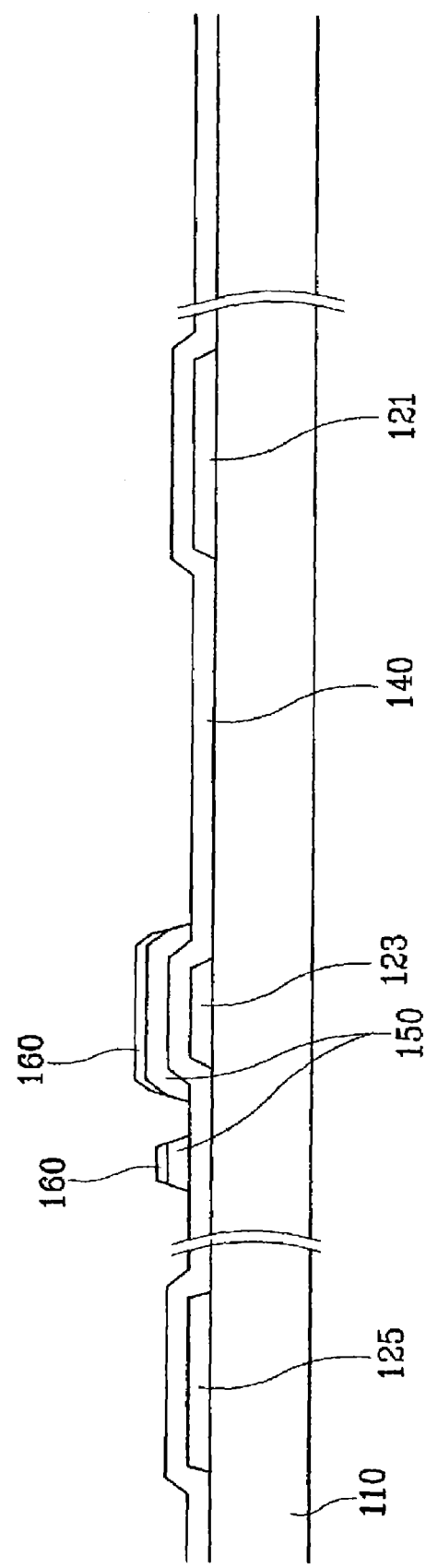
FIG. 5B is a sectional view of the TFT array panel shown in FIG. 5A taken along the line VB–VB' in the step following the step shown in FIG. 4B.

As shown in FIGS. 5A and 5B, triple layers including a gate insulating layer 140 preferably made of silicon nitride, a semiconductor layer preferably made of amorphous silicon, and a doped amorphous silicon layer are sequentially deposited on the substrate 110. The doped amorphous silicon layer and the semiconductor layer are patterned using a mask to form a doped amorphous silicon pattern 160 and the semiconductor layer pattern 150 on the gate insulating layer 140 opposite the gate electrodes 125.

Figure 6A:
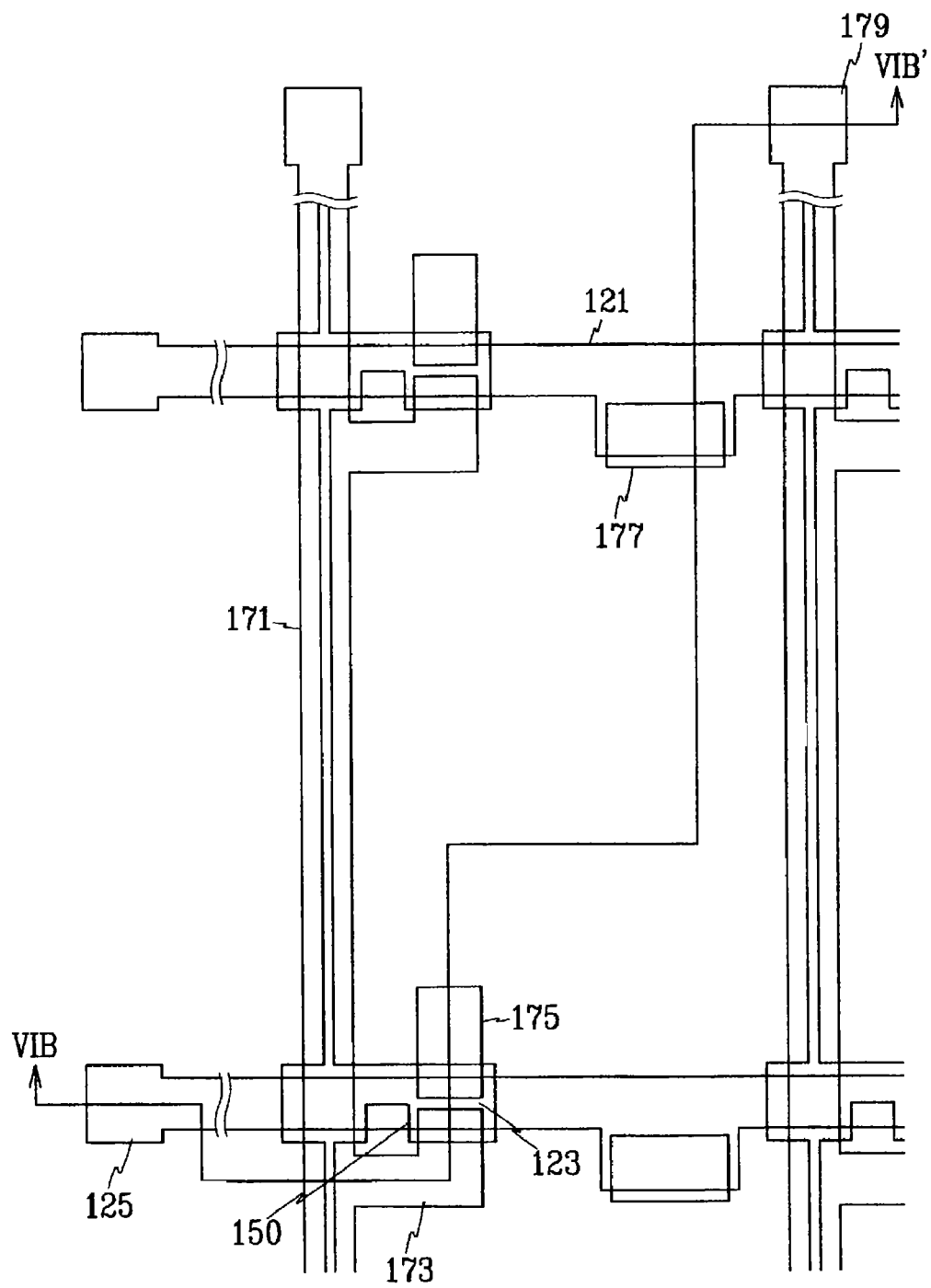
Figure 6B:
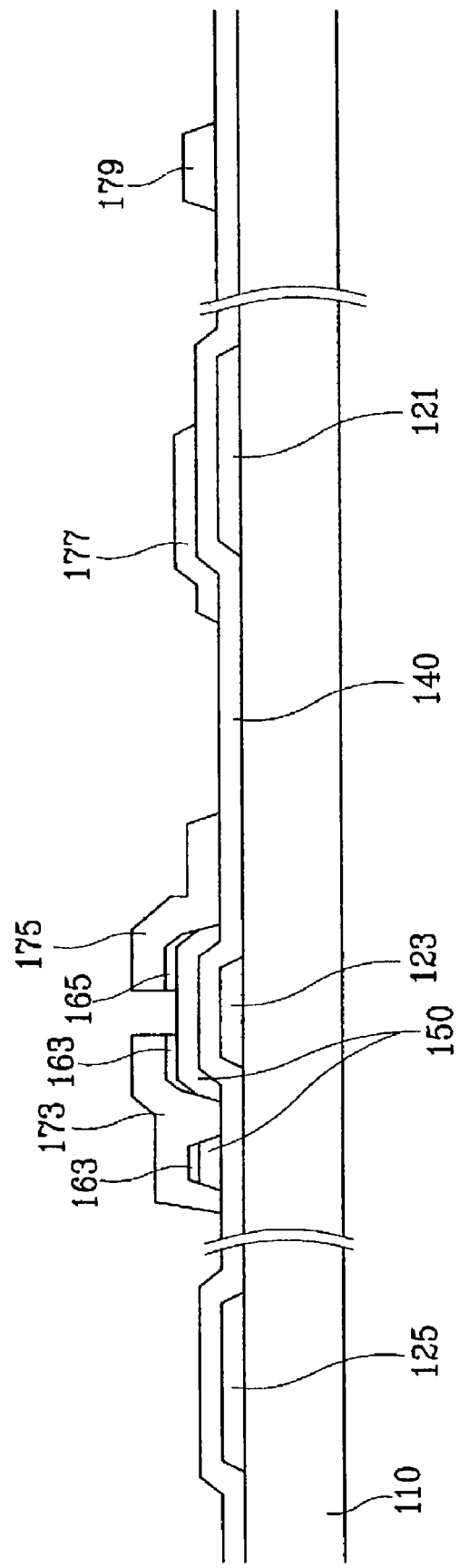
FIG. 6B is a sectional view of the TFT array panel shown in FIG. 6A taken along the line VIB–VIB' in the step following the step shown in FIG. 5B.

Thereafter, as shown in FIGS. 6A and 6B, a conductive layer for a data wire is deposited and patterned by photo-etching using a mask to form a data wire. The data wire includes a plurality of data lines 171 intersecting the gate lines 121, a plurality of source electrodes 173 connected to the data lines 171 and extending onto the gate electrodes 123, a plurality of data pads 179 connected to one ends of the data lines 171, a plurality of drain electrodes 175 separated from the source electrodes 173 and opposite the source electrodes 173 with respect to the gate electrodes 123, and the storage capacitor conductors 177.

Portions of the doped amorphous silicon layer pattern 160, which are not covered by the data wire 171, 173, 175, 177 and 179, are removed such that an ohmic contact layer including a plurality of pairs of two portions 163 and 165 separated across the gate electrodes 123 and portions of the semiconductor layer 150 between the separated portions of the ohmic contact layer 163 and 165 are exposed. In order to stabilize the exposed surface of the semiconductor layer 150, oxygen plasma treatment is preferably performed.

Figure 7A:
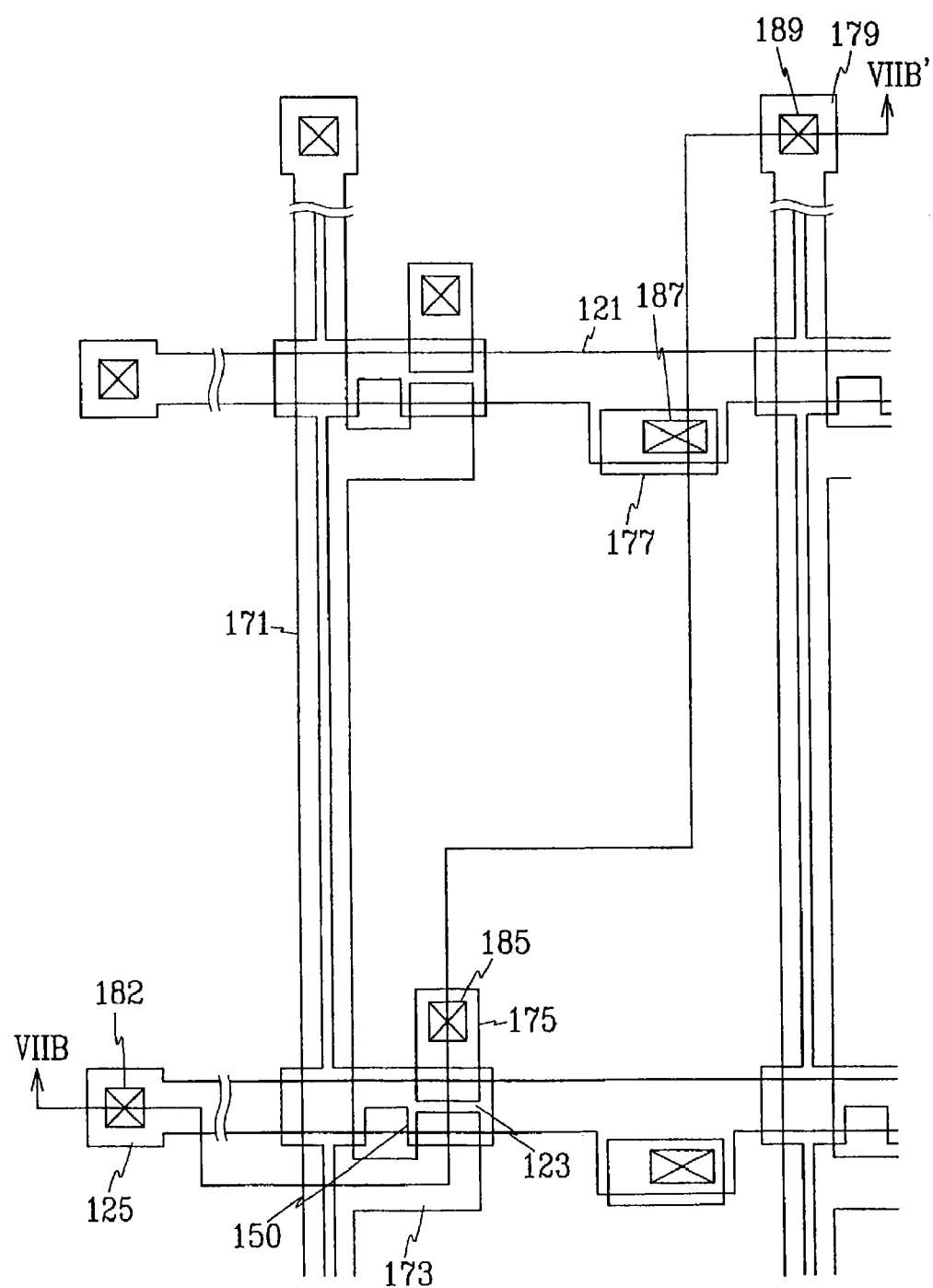
Figure 7B:
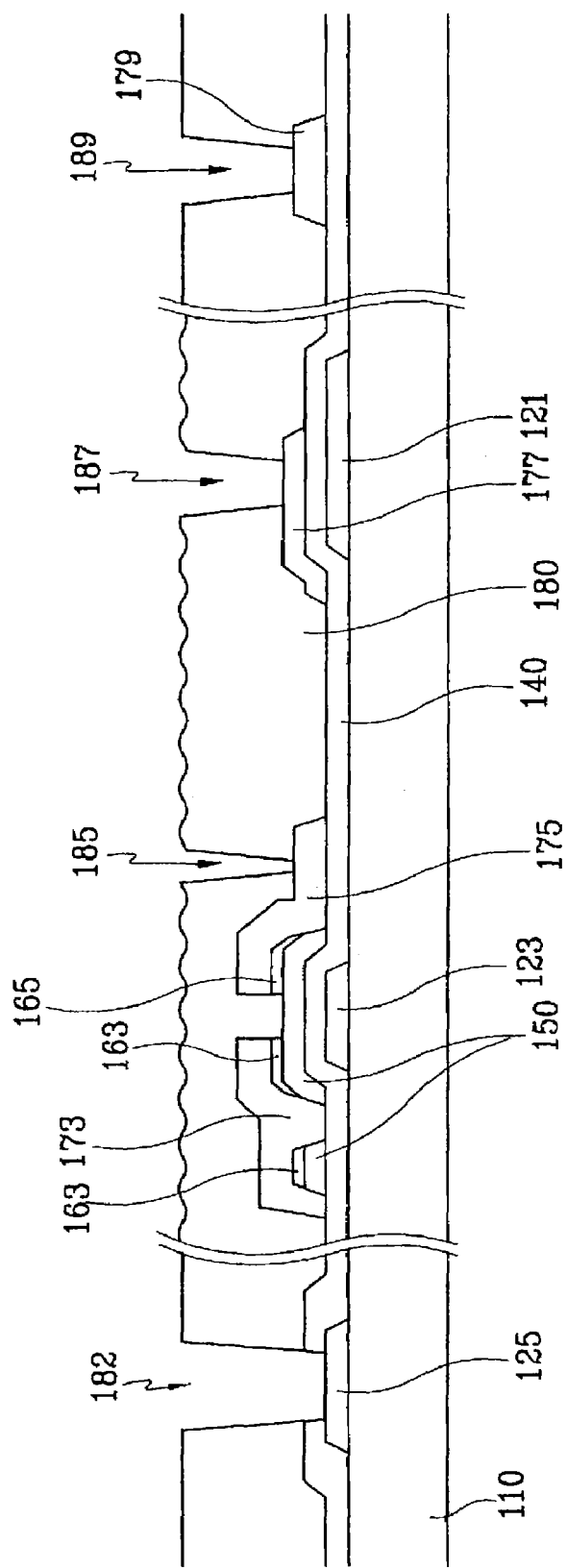
FIG. 7B is a sectional view of the TFT array panel shown in FIG. 7A taken along the line VIIB–VIIB' in the step following the step shown in FIG. 6B.

As shown in FIGS. 7A and 7B, a passivation layer 180 is formed by depositing silicon nitride or by coating organic insulating material having an excellent smoothing characteristic and photosensitivity on the substrate 110. The passivation layer 180 together with the gate insulating layer 140 is patterned by photo-etching using a mask to form a plurality of contact holes 182, 185, 189 and 187 exposing the gate pads 125, the drain electrodes 175, the data pads 179 and the storage capacitor conductors 177 as well as unevenness thereon.

As shown in FIGS. 2 and 3, reflective Ag or Ag alloy having a thickness of 1,000–4,000 Å, preferably 1,500 Å is deposited and patterned by photo-etching using a mask to form a plurality of reflective films 190, a plurality of subsidiary gate pads 92 and a plurality of subsidiary data pads 97. The reflective films 190 are connected to the drain electrodes 175 and the storage capacitor conductors 177 through the contact holes 185 and 187, respectively. The subsidiary gate pads 92 and the subsidiary data pads 97 are connected to the gate pads 125 and the data pads 179 through the contact holes 182 and 189, respectively. At this time, as described above, the patterning is preferably performed by wet etching using an etchant preferably containing ferric nitrate in a range of 1–5%, nitric acid in a range of 1–5%, acetic acid in a range of 5–20%, hexamethylenetetramine in a range of 0.05–1% and deionized water of the remainder.

In the meantime, the above described etchant according to the embodiment of the present invention does not corrode transparent conductive IZO. Accordingly, the etchant is also applicable to a manufacturing method of a TFT array panel for a transflective LCD, which includes pixel electrodes having both a transparent film of IZO and a reflective film of Ag or Ag alloy.

Although it is described above that the embodiment of the present invention is applied to the manufacturing method which forms the semiconductor layer and the data wire by photo-etching using different masks, the method of manufacturing a wire can be well adapted for a method of a TFT array panel for an LCD, which forms the semiconductor layer and the data wire using a single photoresist pattern for minimizing manufacturing cost. It is described in detail with reference to the drawings.

First, a structure of a pixel unit on a TFT array panel for a transflective LCD according to a second embodiment of the present invention is described with reference to FIGS. 8 to 10.

Figure 8:
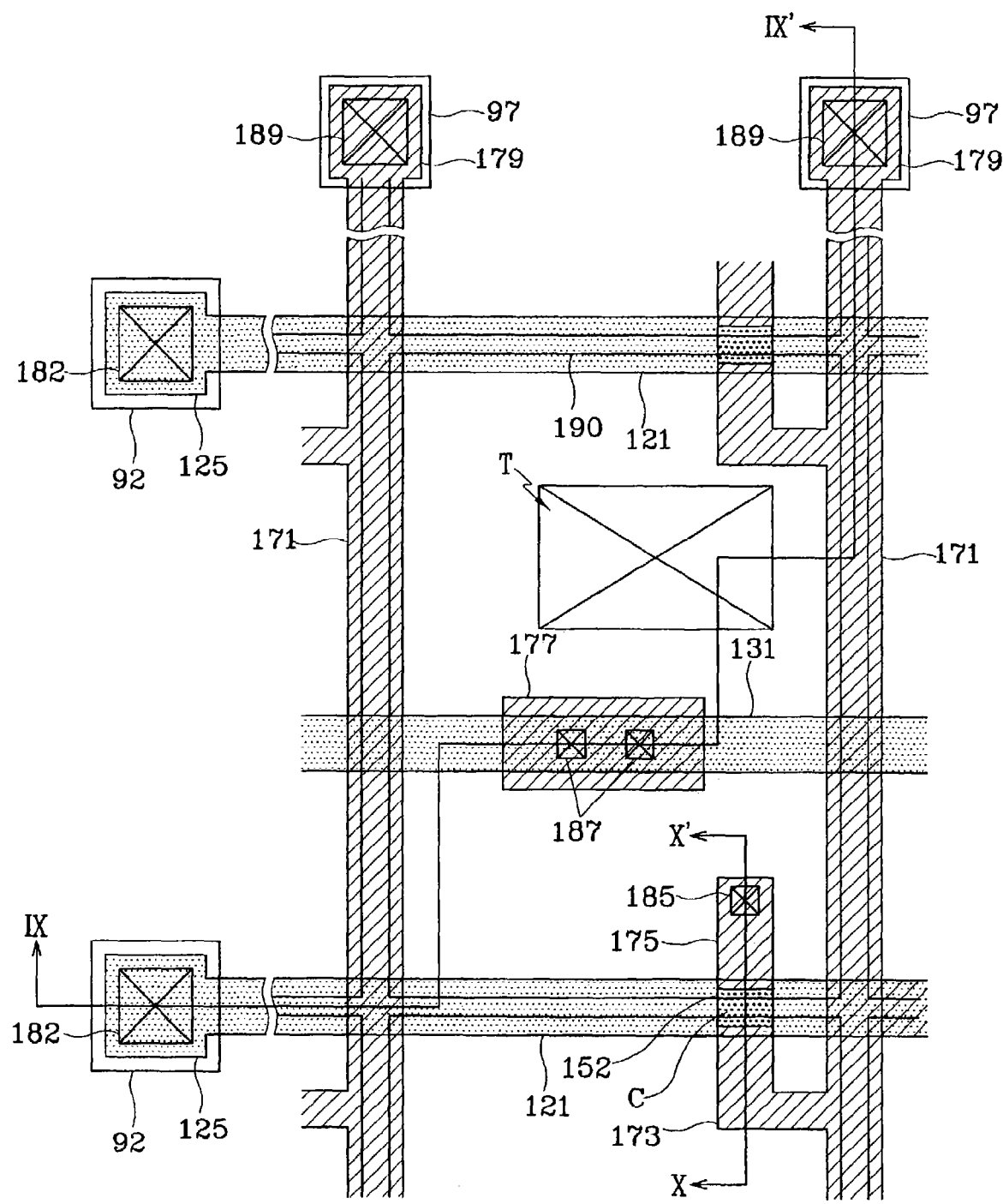
FIG. 8 is a layout view of a TFT array panel for an LCD according to a second embodiment of the present invention.
Figure 9:
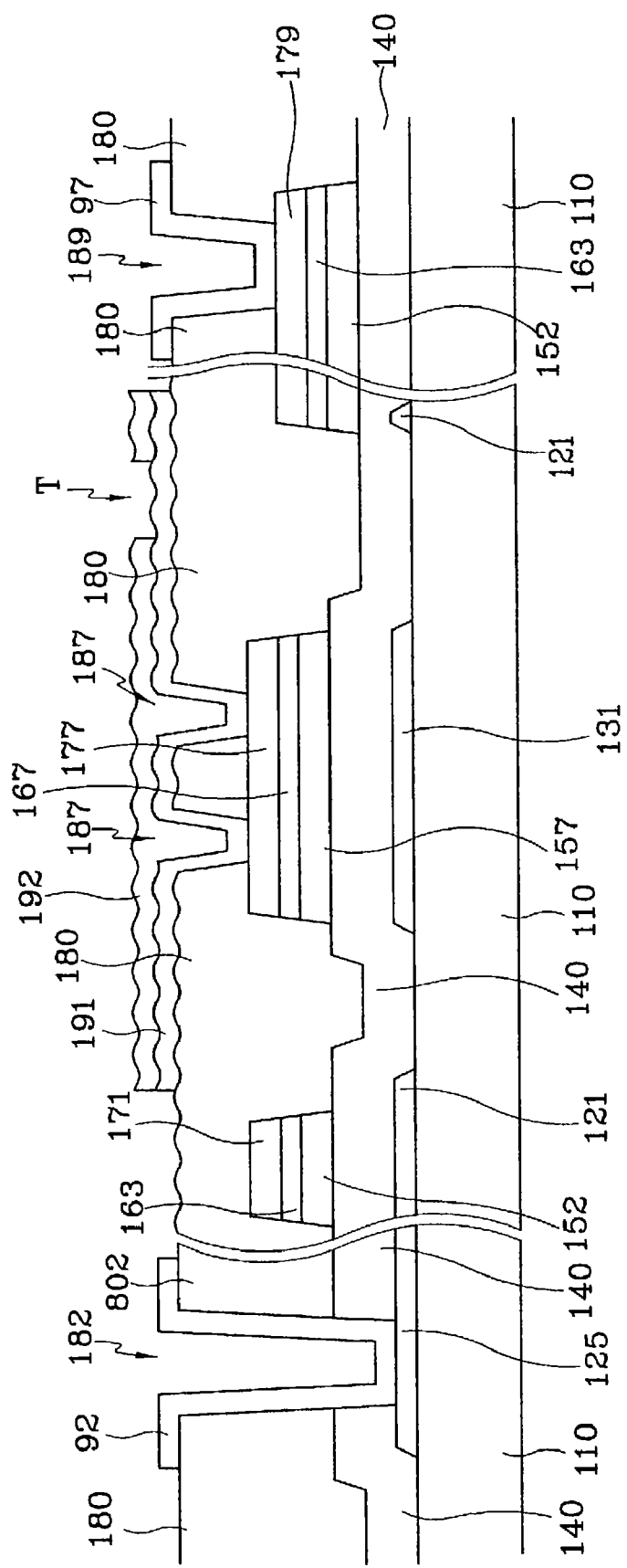
FIGS. 9 and 10 are sectional views of the TFT array panel shown in FIG. 8 taken along the line IX–IX' and the line X–X', respectively.
Figure 10:
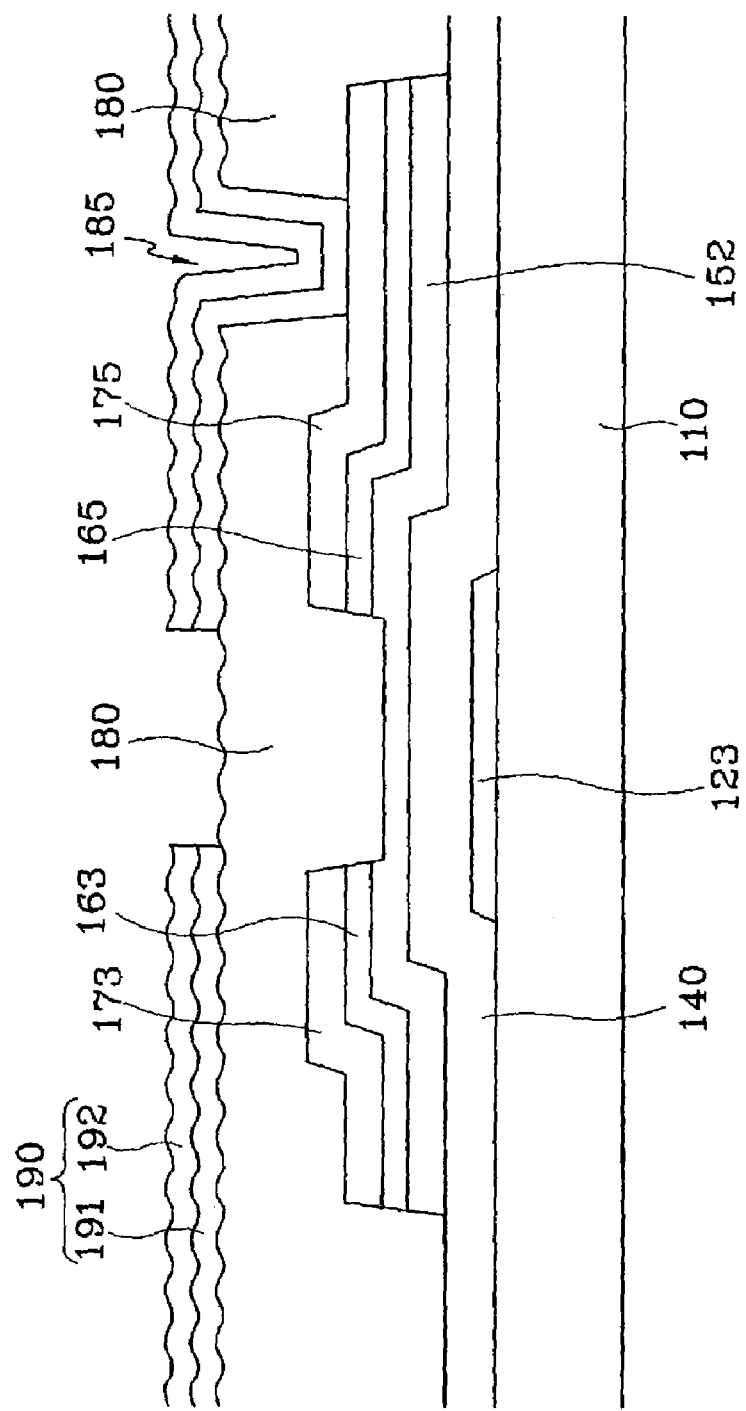

FIG. 8 is a layout view of a TFT array panel for an LCD according to a second embodiment of the present invention, and FIGS. 9 and 10 are sectional views of the TFT array panel shown FIG. 8 taken along the line IX–IX' and the line X–X', respectively.

A gate wire preferably made of conductive material having low resistivity is formed on an insulating substrate 110. The gate wire includes a plurality of gate lines 121, a plurality of gate pads 125, and a plurality of gate electrodes 123. The gate wire also includes a plurality of storage electrodes 131 extending substantially parallel to the gate lines 121 and are supplied with a predetermined voltage such as a common voltage from an external device, which is applied to a common electrode of an upper panel. The storage electrodes 131 overlap storage capacitor conductors 177 connected to pixel electrodes 190 to form storage capacitors for enhancing the charge storing capacity of the pixels, which will be described later. In case the overlapping of the pixel electrodes 190 and the gate lines 121 gives sufficient storage capacitance, the storage electrodes 131 may be omitted.

A gate insulating layer 140 preferably made of SiNx is formed on the gate wire 121, 125, 123 and 131 to cover the gate wire 121, 125, 123 and 131.

A semiconductor pattern 152 and 157 preferably made of polysilicon or amorphous silicon is formed on the gate insulating layer 140. An ohmic contact pattern (or an intermediate layer pattern) 163, 165 and 167 preferably made of amorphous silicon heavily doped with n type impurity such as phosphorous P or p type impurity is formed on the semiconductor pattern 152 and 157.

A data wire including a conductive layer having low resistivity like the first embodiment is formed on the ohmic contact pattern 163, 165 and 167. The data wire includes a plurality of data line units 171, 173 and 179, a plurality of drain electrodes 175 for TFTs, and a plurality of storage capacitor conductors 177. Each data line unit 171, 173 and 179 includes a data line 171 extending substantially in a longitudinal direction, a data pad 179 connected to one end of the data line 171 to receive image signals from an external device, and a plurality of source electrodes 173 of TFTs branched from the data line 171. Each drain electrode 175 is separated from,the data line units 171, 173 and 179 and placed opposite to the corresponding source electrode 173 with respect to the corresponding gate electrode 123 or the channel portion C of the TFT. The storage capacitor conductors 177 are placed on the storage capacitor electrodes 131. In the absence of the storage electrodes 131, the storage capacitor conductors 177 are also omitted.

The data wire 171, 173, 175, 177 and 179 may include a conductive layer preferably made of Ag, Ag alloy, Al, Al alloy, Cr, Mo, Mo alloy, Ta or Ti.

The ohmic contact pattern 163, 165 and 167 reduces the contact resistance between the underlying semiconductor pattern 152 and 157 and the overlying data wire 171, 177, 173, 175 and 179 and has substantially the same shape as the data wire 171, 177, 173, 175 and 179. That is, the ohmic contact pattern 163, 165 and 167 includes a plurality of data-line ohmic contacts 163 having substantially the same shapes as the data line units 171, 179 and 173, a plurality of drain-electrode ohmic contacts 163 having substantially the same shapes as the drain electrodes 173, and a plurality of storage-capacitor ohmic contacts 167 having substantially the same shapes as the storage capacitor conductors 177.

Meanwhile, the semiconductor pattern 152 and 157 has substantially the same shape as the data wire 171, 177, 173,175 and 179 and the ohmic contact pattern 163, 165 and 167 except for the TFT channel areas C. Specifically, the semiconductor pattern 152 and 157 includes a plurality of storage-capacitor semiconductors 157 having substantially the same shapes as the storage capacitor conductors 177 and the storage-capacitor ohmic contacts 167, and a plurality of TFT semiconductors 152 which have slightly different shapes from the remains of the data wire and the ohmic contact pattern. That is, the source and the drain electrodes 173 and 175 are separated from each other at the TFT channel areas C, where the data-line ohmic contacts 163 and the drain-electrode ohmic contacts 165 are also separated from each other. However, the TFT semiconductors 152 continue to proceed there without disconnection to form TFT channels.

A passivation layer 180 is formed on the data wire 171, 177, 173, 175 and 179 and the semiconductors 152, which are not covered with the data wire 171, 177, 173, 175 and 179. The passivation layer 180 preferably includes an insulating layer such as silicon nitride and silicon oxide, or an organic insulating layer preferably made of low dielectric organic material. It is preferable that the organic insulating layer is located at the top and its surface has unevenness to cause reflective films, which will be formed later, to have embossment. The insulating layer is preferably disposed such that it covers the semiconductor pattern 152 directly.

The passivation layer 180 has a plurality of contact holes 185, 189 and 187 exposing the drain electrodes 175, the data pads 179 and the storage capacitor conductors 177. The passivation layer 180 together with the gate insulating layer 140 is further provided with a plurality of contact holes 182 exposing the gate pads 125.

A plurality of pixel electrodes 190 receiving image signals from the TFTs and generating electric fields in cooperation with an electrode of an upper panel are formed on the passivation layer 180. Each pixel electrode 190 includes a transparent film 191 and a reflective film 192. The transparent film 191 is made of transparent conductive material such as IZO. The reflective film 192 is placed on the transparent film 191 and has a transparent area T in a pixel area. In addition, the reflective film 192 is made of Ag or Ag alloy.

The pixel electrodes 190 are physically and electrically connected to the drain electrodes 175 through the contact holes 185 to receive the image signals. The pixel electrodes 190 overlap the gate lines 121 and the data lines 171 adjacent thereto for enlarging aperture ratio, but the overlapping may be omitted. The pixel electrodes 190 are also connected to the storage capacitor conductors 177 through the contact, holes 187 to transmit the image signals to the conductors 177.

Meanwhile, a plurality of subsidiary gate pads 92 and a plurality of subsidiary data pads 97 are formed on the gate pads 125 and the data pads 179 to be connected thereto through the contact holes 182 and 189, respectively. The subsidiary gate pads 92 and the subsidiary data pads 97 compensate the adhesiveness of the pads 125 and 179 to external circuit devices and protect the pads 125 and 179. The subsidiary gate pads 92 and the subsidiary data pads 97 are not requisites but may be introduced in a selective manner.

A method of manufacturing the TFT array panel for an LCD shown in FIG. 8–10 will be now described in detail with reference to FIGS. 11A to 18C as well as FIGS. 8 and 10.

Figure 11A:
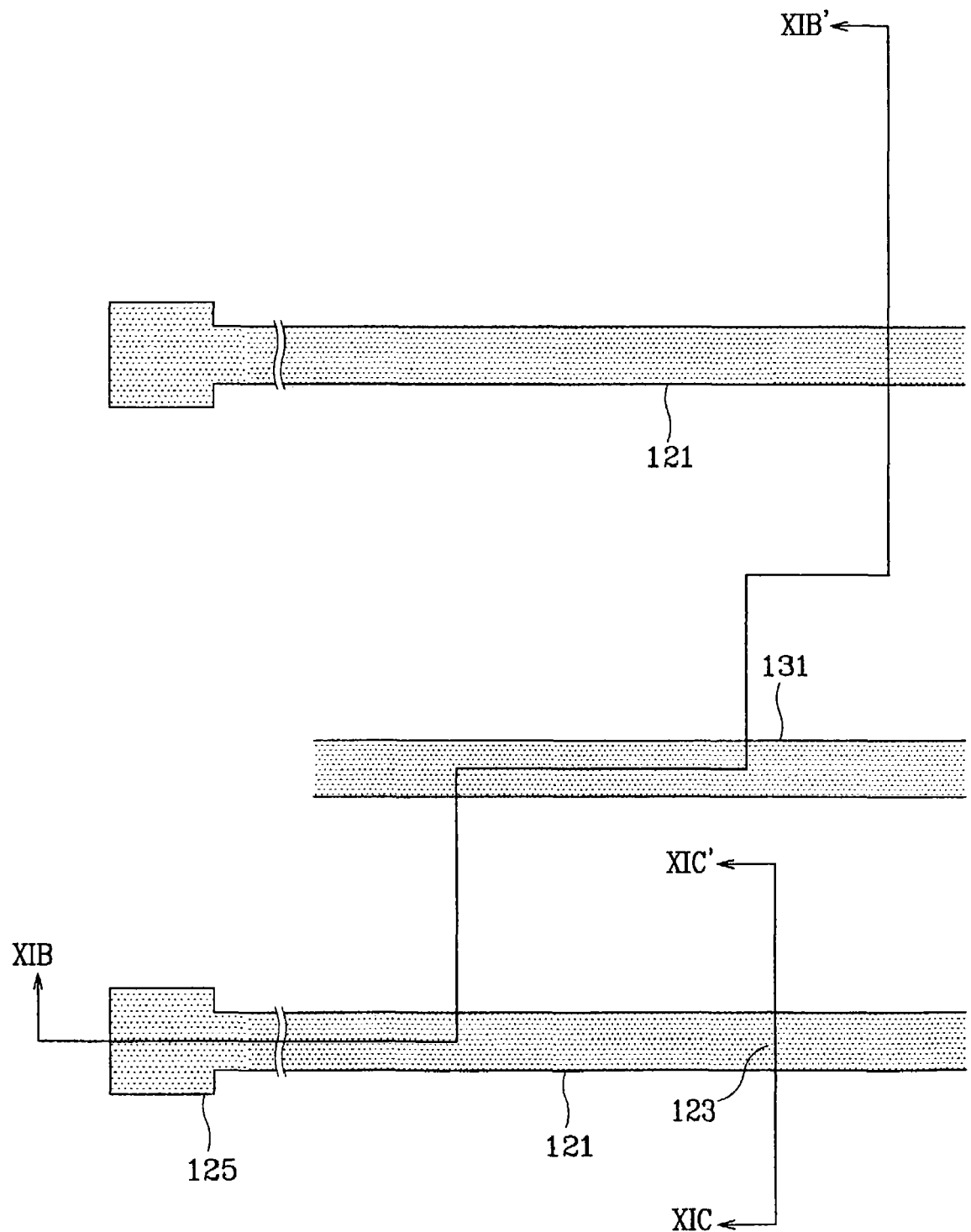
FIG. 11A is a layout view of the TFT array panel shown in FIG. 8 in the first step of a manufacturing method according to the second embodiment of the present invention.
Figure 11B:
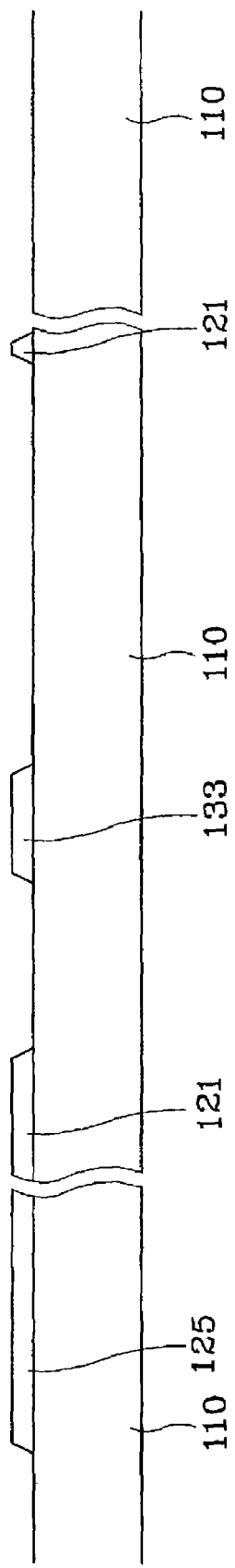
FIGS. 11B and 11C are sectional views of the TFT array panel shown in FIG. 11A taken along the line XIB–XIB' and the line XIC–XIC', respectively.
Figure 11C:
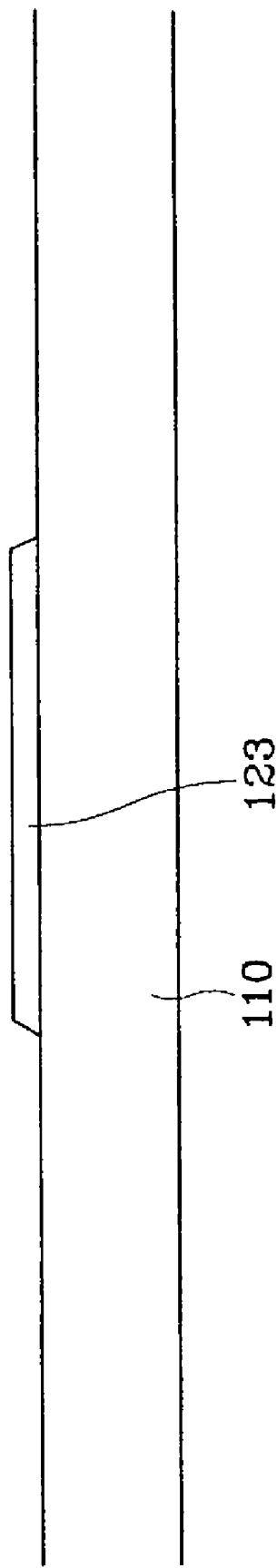

First, as shown in FIGS. 11A to 11C, a conductive layer including Ag, Ag alloy, Al or Alloy is deposited, and patterned by photo-etching using a mask to form a gate wire. The gate wire includes a plurality of gate lines 121, a plurality of gate electrodes 123, a plurality of gate pads 125, and a plurality of storage electrodes 131.

Figure 12A:
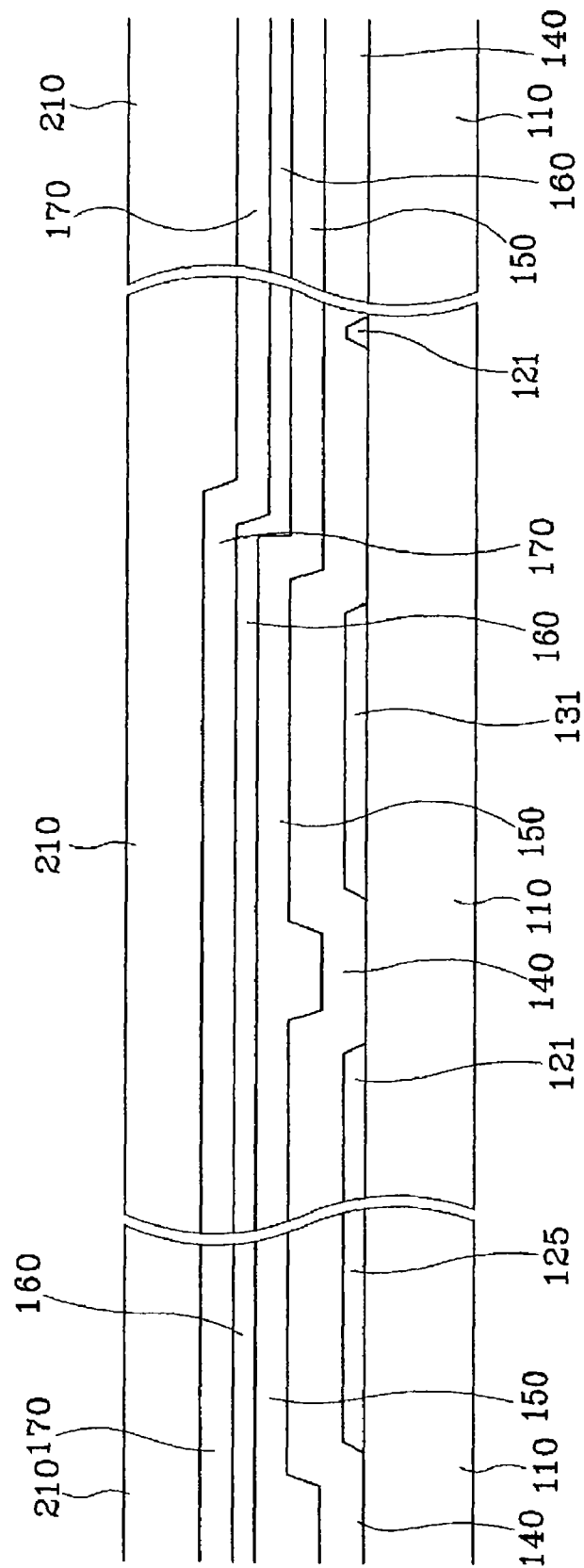
FIGS. 12A and 12B are sectional views of the TFT array panel shown in FIG. 11A taken along the line XIB–XIB' and the line XIC–XIC', respectively, in the step following the step illustrated in FIGS. 11B and 11C.
Figure 12B:
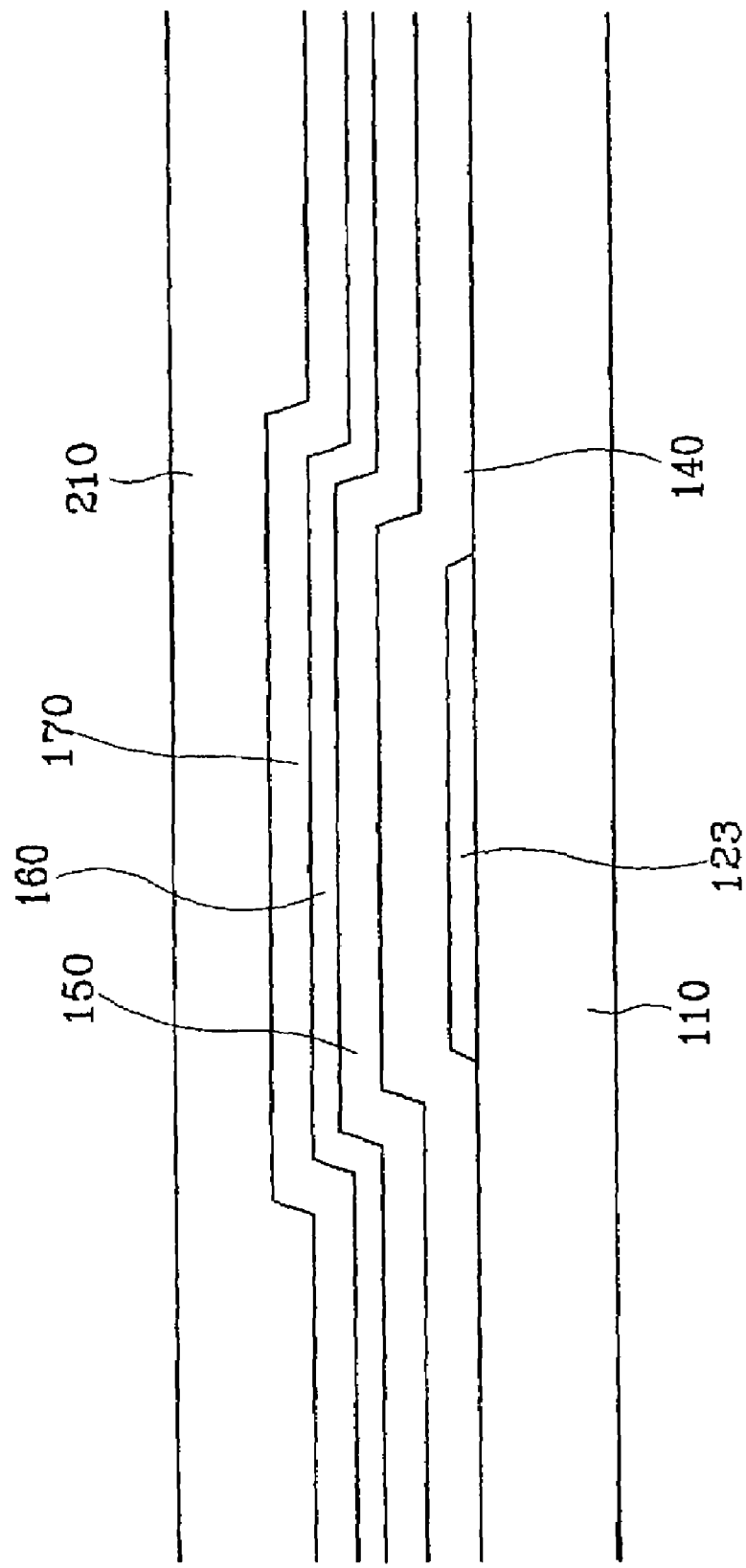

As shown in FIGS. 12A and 12B, a silicon nitride gate insulating layer 140 with 1,500–5,000 Å thickness, a semiconductor layer 150 with 500–2,000 Å thickness of undoped amorphous silicon, and an intermediate layer 160 with 300–600 Å thickness of doped amorphous silicon are sequentially deposited on the substrate 110 by CVD. A conductive layer 170 with thickness of 1,500–3,000 Å is sputtered, and a photoresist film 210 with thickness of 1–2 microns is coated thereon.

Figure 13A:
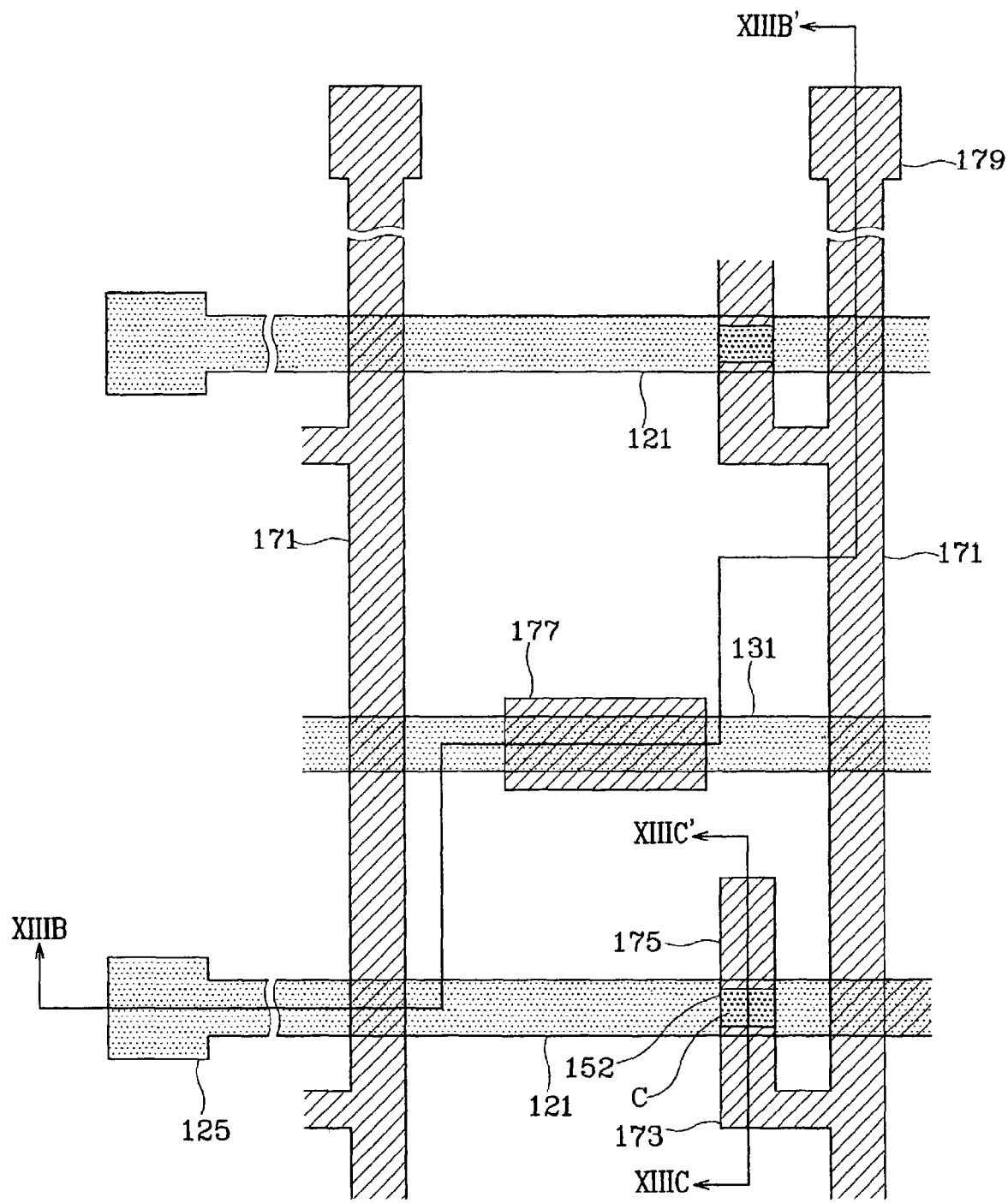
FIG. 13A is a layout view of the TFT array panel in the step following the step illustrated in FIGS. 12A and 12B.
Figure 13B:
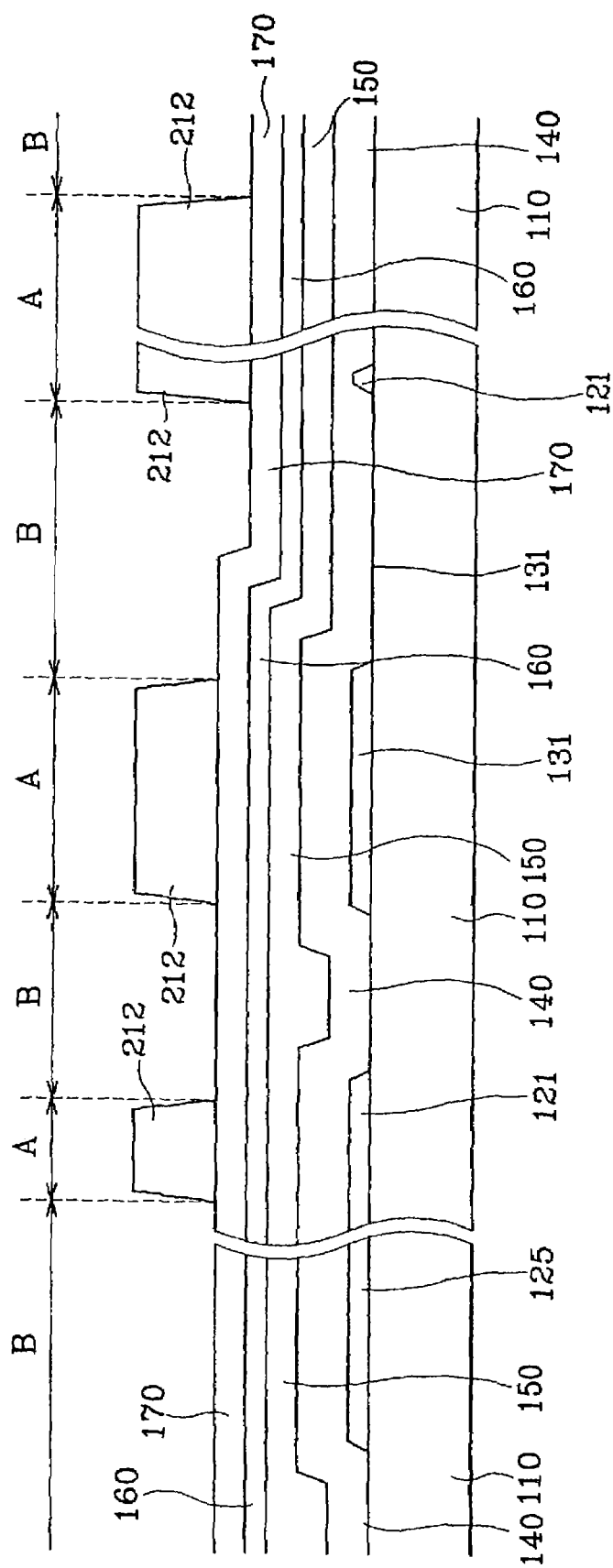
FIGS. 13B and 13C are sectional views of the TFT array panel shown in FIG. 13A taken along the line XIIIB–XIIIB' and the line XIIIC–XIIIC', respectively.
Figure 13C:
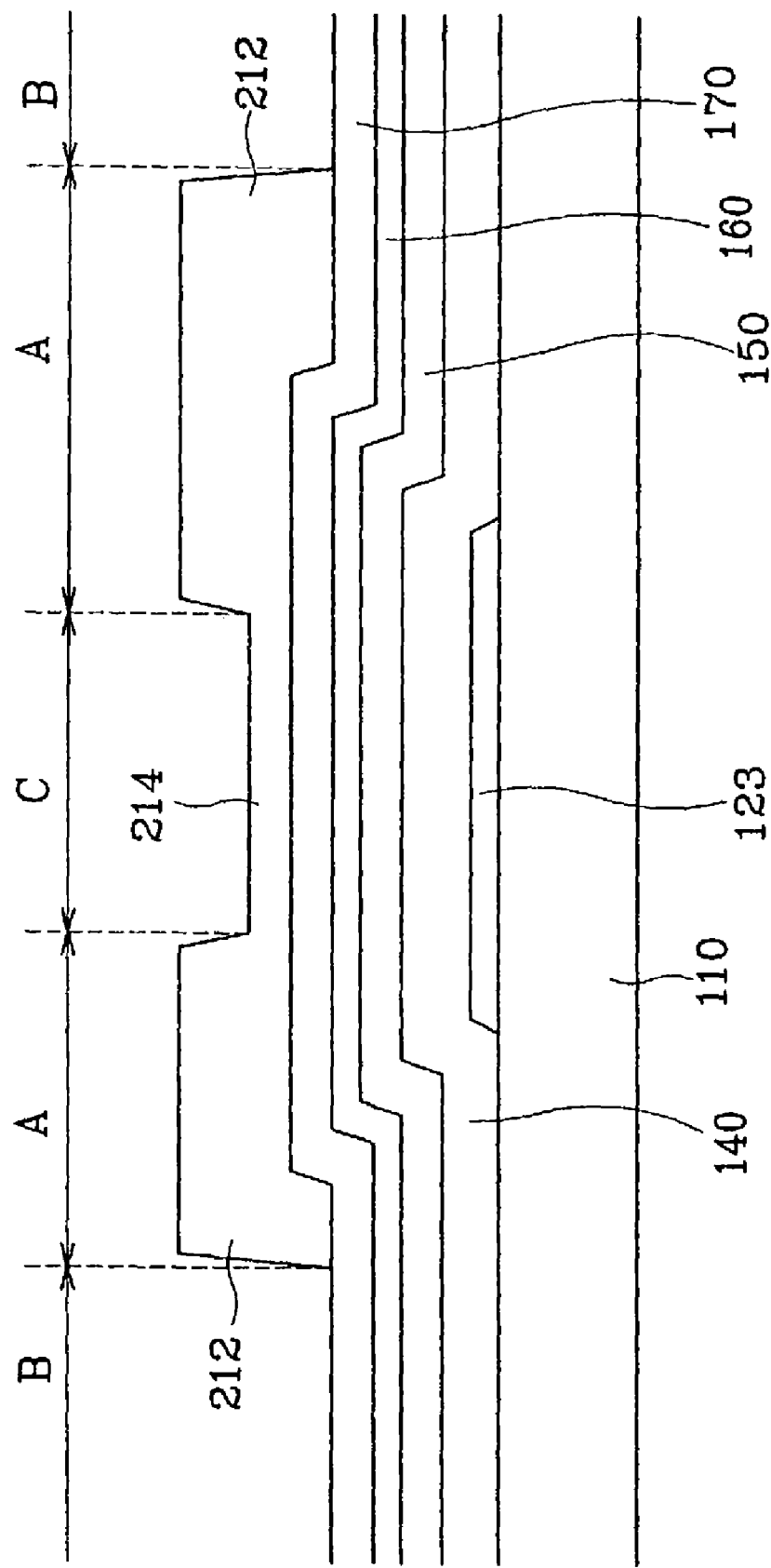

Thereafter, the photoresist film 210 is exposed to light through a mask and is developed to form a photoresist pattern 212 and 214 having a plurality of first portions and a plurality of second portions as shown in FIGS. 13B and 13C. Each of the first portions 214 of the photoresist pattern 212 and 214 is located on the channel area C of a TFT, which is placed between a source electrode 173 and a drain electrode 175. Each of the second portions 212 is located on a data area A located at a place where a data wire 171, 177, 173, 175 and 179 is formed. All portions of the photoresist film on the remaining areas B are removed, and the first portions 214 are made to be thinner than the second portions 212. Here, the ratio of the thickness of the first portion 214 on the channel area C and the second portion 212 on the data area A is adjusted depending on process conditions of subsequent etching steps described later, and it is preferable that the thickness of the first portion 214 is equal to or less than a half of that of the second portion 212, for example, equal to or less than 4,000 Å.

The position-dependent thickness of the photoresist pattern 212 and 214 are obtained by several techniques. A slit pattern, a lattice pattern or a translucent film is provided on the mask in order to adjust the light transmittance in the area C.

When using a slit pattern, it is preferable that width of the slits and a gap between the slits is smaller than the resolution of an exposer used for the photolithography. In case of using a translucent film, thin films with different transmittances or different thickness may be used to adjust the transmittance on the masks.

When a photoresist film is exposed to light through such a mask, polymers of a portion directly exposed to the light are almost completely decomposed, and those of a portion exposed to the light through a slit pattern or a translucent film are not completely decomposed because the amount of a light irradiation is small. The polymers of a portion of the photoresist film blocked by a light-blocking film provided on the mask are hardly decomposed. After the photoresist film is developed, the portions containing the polymers, which are not decomposed, is left. At this time, the thickness of the portion with less light exposure is thinner than that of the portion without light exposure. Since too long exposure time decomposes all the molecules, it is necessary to adjust the exposure time.

The first portion 214 of the photoresist pattern may be obtained using reflow. That is, the photoresist film is made of a reflowable material and exposed to light through a normal mask having opaque and transparent portions. The photoresist film is then developed and subject to reflow such that portions of the photoresist film flows down onto areas without photoresist, thereby forming the thin portion.

Next, the photoresist film 214 and the underlying layers including the conductive layer 170, the intermediate 160 and the semiconductor layer 150 are etched such that the data wire and the underlying layers are left on the data areas A, only the semiconductor layer is left on the channel areas C, and all the three layers 170, 160 and 150 are removed to expose the gate insulating layer 140 on the remaining areas B.

Figure 14A:
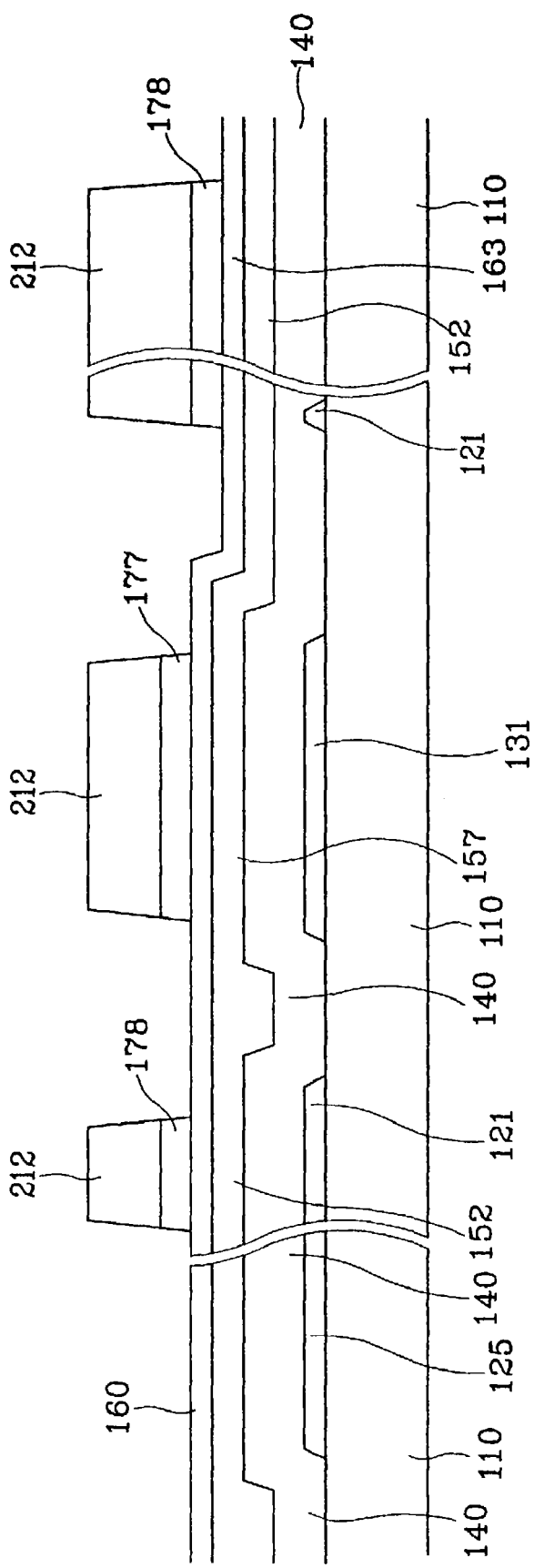

First, as shown in FIGS. 14A and 14B, the exposed portions of the conductive layer 170 on the other areas B are removed to expose the underlying portions of the intermediate layer 160. Both dry etch and wet etch are selectively used in this step and preferably performed under the condition that the conductive layer 170 is easily etched and the photoresist pattern 212 and 214 are hardly etched. However, since it is hard to identify the above-described condition for dry etch, and the dry etch may be performed under the condition that the photoresist pattern 212 and 214 and the conductive layer 170 are etched simultaneously. In this case, the first portion 214 for dry etch is preferably made to be thicker than that for the wet etch to prevent the removal of the first portion 214 and thus the exposure of the underlying portions of the conductive layer 170.

As a result, as shown in FIG. 14A and FIG. 14B, only the portions of the conductive layer 170 on the channel areas C and the data areas A, that is, the source/drain ("S/D") conductors 178 and the storage capacitor conductors 177 are left and the remaining portions of the conductive layer 170 on the remaining areas B are removed to expose the underlying portions of the intermediate layer 160. Here, the S/D conductors 177 have substantially the same planar shapes as the data wire 171, 177, 173, 175 and 179 except that the source electrodes 173 and the drain electrodes 175 are not disconnected from but connected to each other. When using dry etching, the thickness of the photoresist pattern 212 and 214 is reduced to an extent.

Figure 15A:
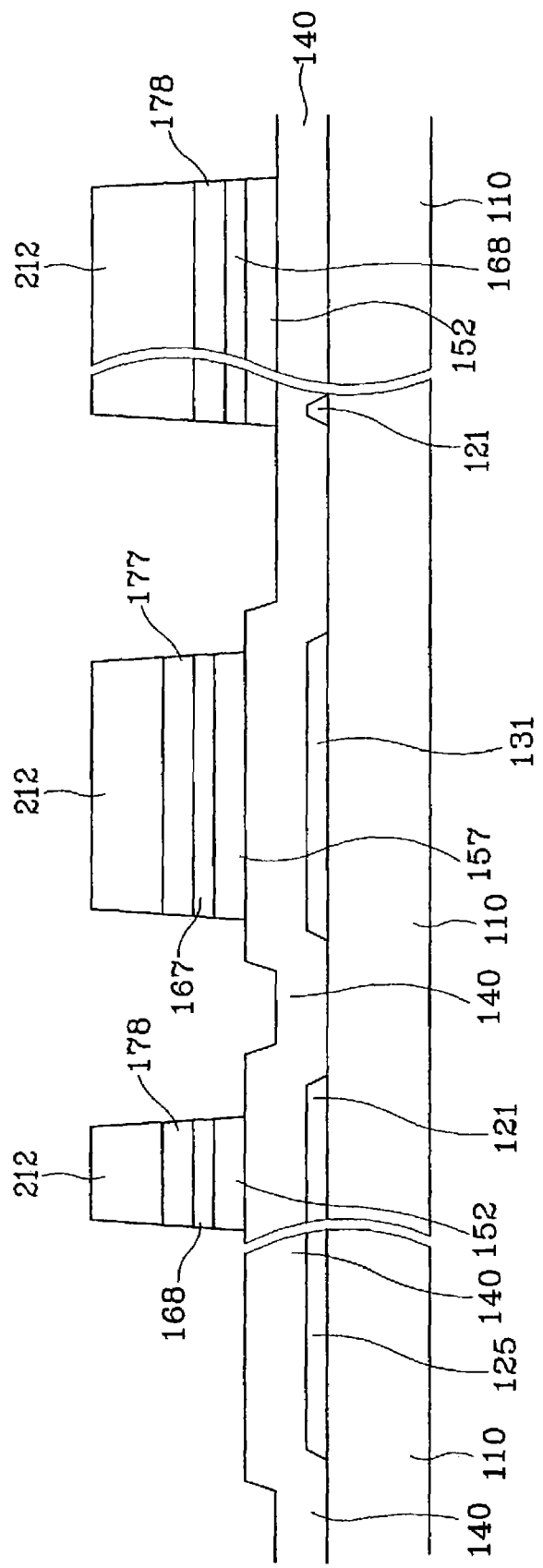
Figure 15B:
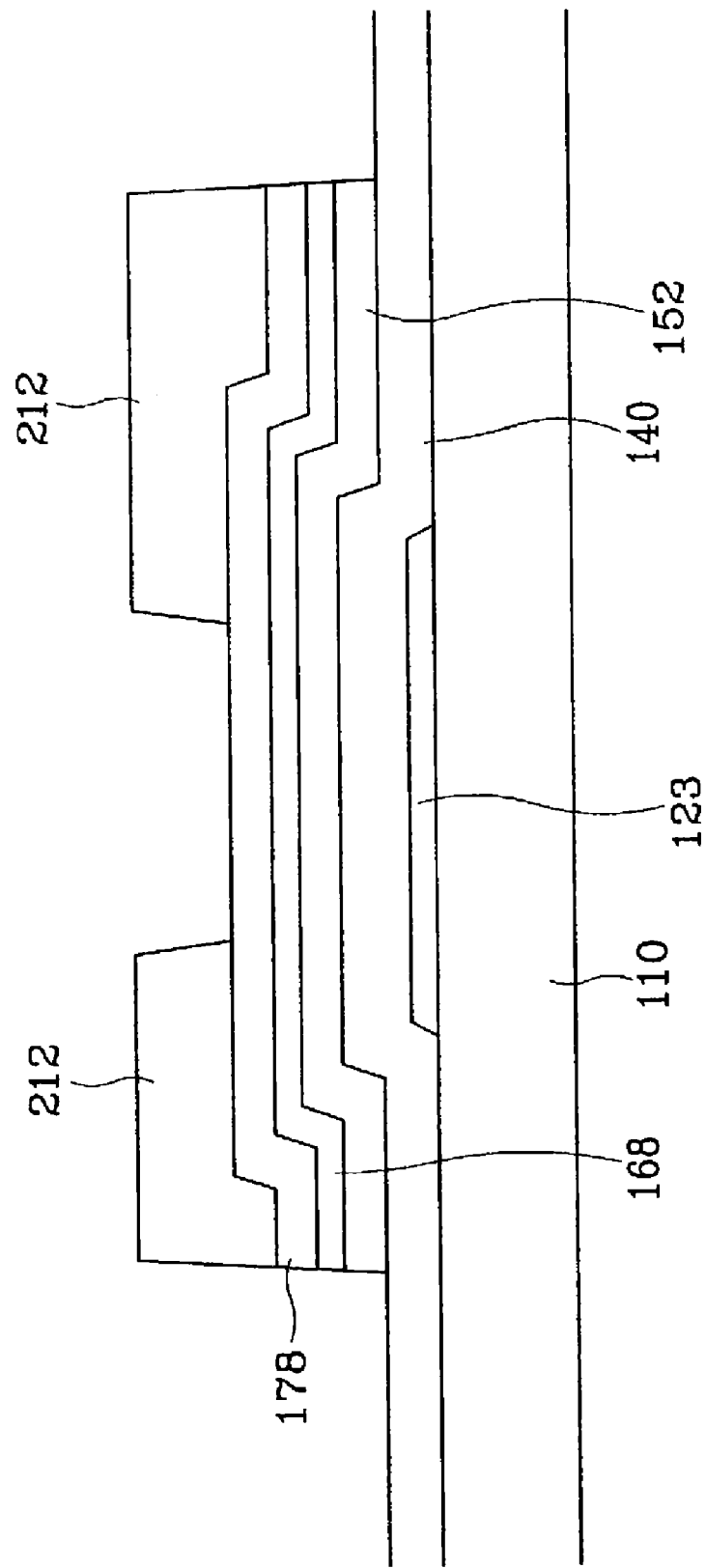

Next, as shown in FIG. 15A and FIG. 15B, the exposed portions of the intermediate layer 160 and the underlying portions of the semiconductor layer 150 on the areas B as well as the first portion 214 of the photoresist pattern 212 and 214 are removed by dry etch. The etching is performed under the condition that the photoresist pattern 212 and 214, the intermediate layer 160 and the semiconductor layer 150 are easily etched and the gate insulating layer 140 is hardly etched. (It is noted that etching selectivity between the intermediate layer and the semiconductor layer is nearly zero.) In particular, it is preferable that the etching ratios for the photoresist pattern 212 and 214 and the semiconductor layer 150 are nearly the same. For instance, the etched thicknesses of the photoresist pattern 212 and 214 and the semiconductor layer 150 can be nearly the same by using a gas mixture of $SF_6$ and HCl, or a gas mixture of $SF_6$ and $O_2$. When the etching ratios for the photoresist pattern 212 and 214 and for the semiconductor pattern 150 are the same, the initial thickness of the first portion 214 is equal to or less than the sum of the thickness of the semiconductor layer 150 and the thickness of the intermediate layer 160.

Consequently, as shown in FIGS. 15A and 15B, the first portions 214 on the channel areas C are removed to expose the underlying portions of the S/D conductors 178, and the portions of the intermediate layer 160 and the semiconductor layer 150 on the remaining areas B are removed to expose the underlying portions of the gate insulating layer 140. In the meantime, the second portions 212 on the data areas A are also etched to become thinner. Moreover, the semiconductor pattern 152 and 157 is completed in this step. The reference numerals 168 and 167 refer to S/D ohmic contacts under the S/D conductors 178 and storage-capacitor ohmic contacts under the storage capacitor conductors 177, respectively.

Then, photoresist remnants left on the surface of the S/D conductors 178 on the channel areas C are removed by ashing.

Figure 16A:
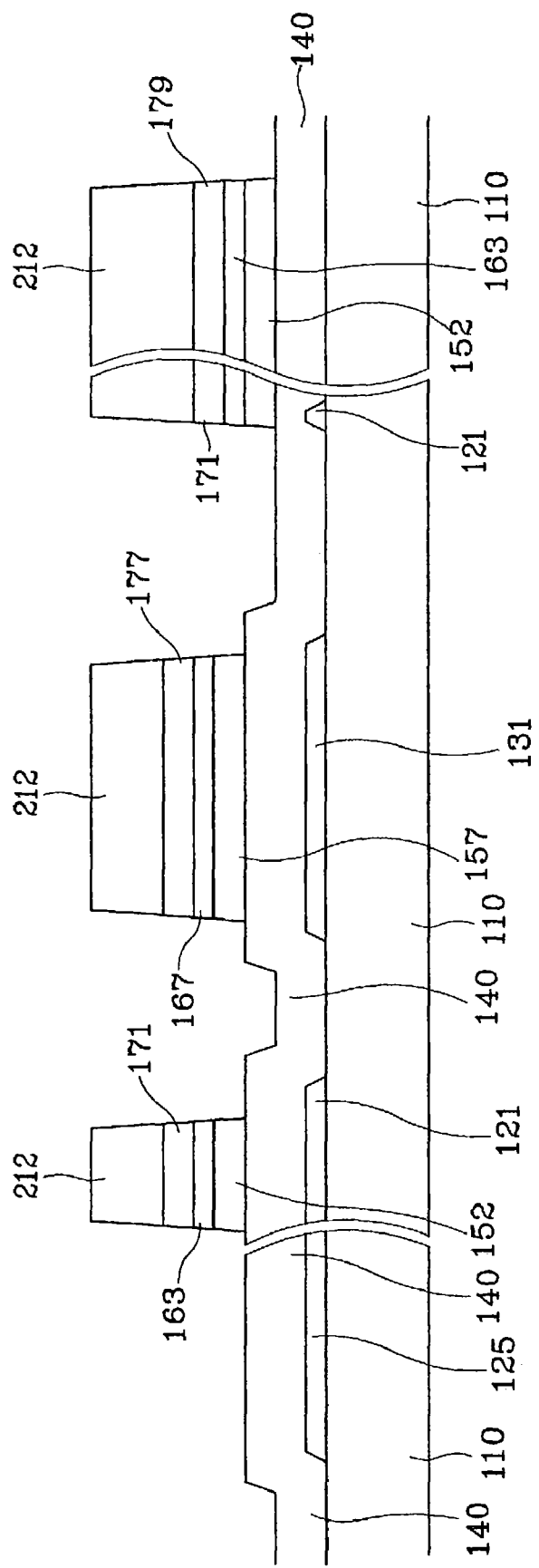
Figure 16B:
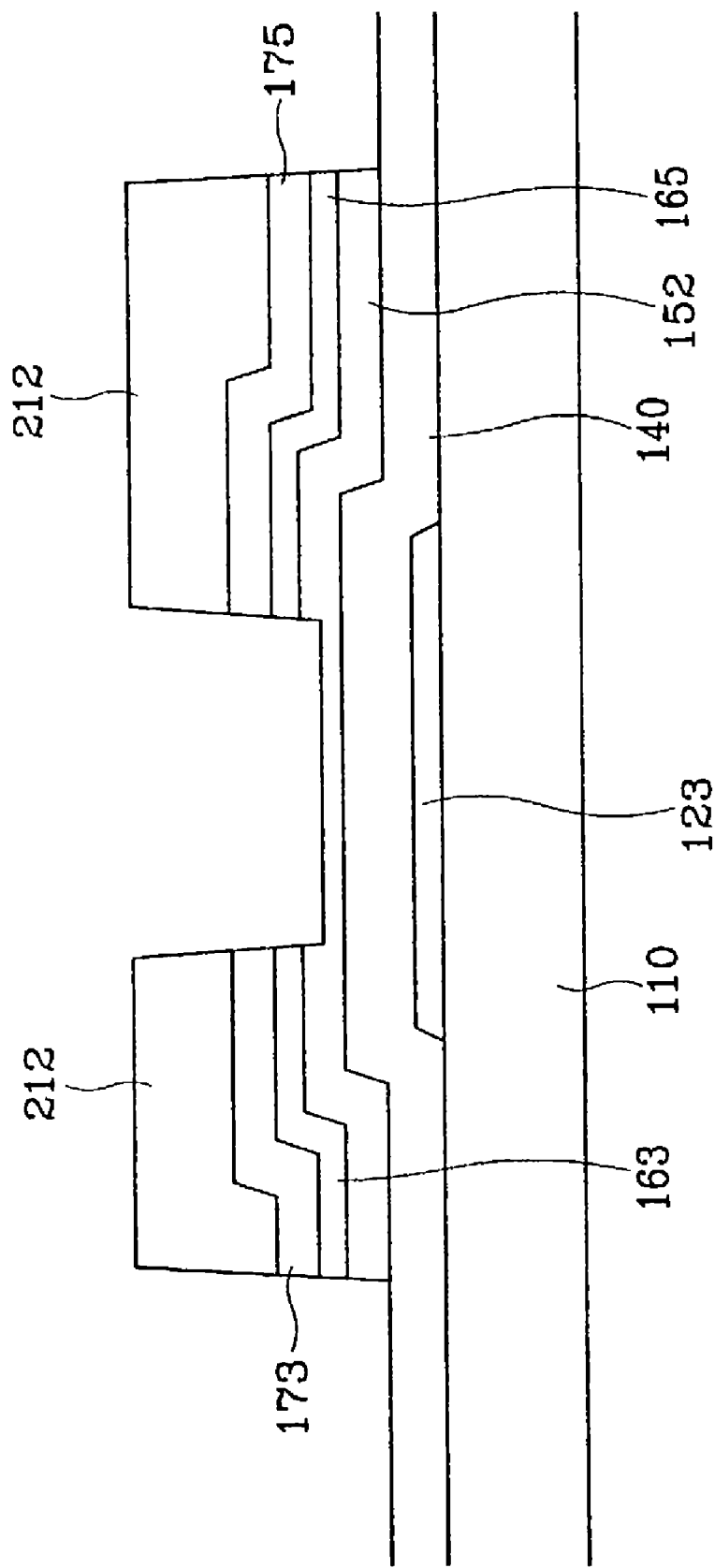

Next, as shown in FIGS. 16A and 16B, portions of the S/D conductors 178 and the underlying portions of the S/D ohmic contacts 168 on the channel areas C are etched to be removed. Here, the etching of both the S/D conductors 178 and the S/D ohmic contacts 168 may be done using only dry etching. Alternatively, the S/D conductors 178 are etched by wet etching and the S/D ohmic contacts 168 are etched by dry etching. In the former case, it is preferable to perform the etching under the condition that etching selectivity between the S/D conductors 178 and the S/D ohmic contacts 168 is high. It is because the low etching selectivity makes the determination of the etching finish point difficult, thereby causing the adjustment of the thickness of the portions of the semiconductor pattern 152 left on the channel areas C to be difficult. In the latter case alternately applying wet etching and dry etching, a stepwise lateral sidewall is formed since the wet etch etches the lateral sides of the S/D conductors 178, while the dry etch hardly etches the lateral sides of the S/D ohmic contacts 168. Examples of etching gases used for etching the S/D ohmic contacts 168 are a gas mixture of $CF_4$ and HCl and a gas mixture of $CF_4$ and $O_2$. Use of the gas mixture of CF4 and O2 enables to obtain uniform thickness of etched portions of the semiconductor pattern 152 and 157. In this regard, as shown in FIG. 16B, the exposed portions of the semiconductor pattern 152 and 157 are etched to have a reduced thickness, and the second portions 212 of the photoresist pattern 212 and 214 are also etched to have a reduced thickness. This etching is performed under the condition that the gate insulating layer 140 is not etched, and it is preferable that the photoresist pattern 212 and 214 is thick enough to prevent the second portions 212 from being removed to expose the underlying portions of the data wire 171, 173, 175, 177 and 179.

Accordingly, the source electrodes 173 and the drain electrodes 175 are separated from each other, and, simultaneously, the data wire 171, 173, 175, 177 and 179 and the ohmic contact pattern 163, 165 and 167 thereunder are completed.

Finally, the second portions 212 of the photoresist pattern 212 and 214 left on the data areas A are removed. Alternatively, the second portions 212 are removed after the portions of the S/D conductors 178 on the channel areas C are removed and before the underlying portions of the S/D ohmic contacts 168 are removed.

As described above, wet etching and dry etching may be performed one after the other, but only dry etching may be used. The latter is relatively simple but it is not easy to find a proper etching condition compared with the former. On the contrary, it is easy to find a proper etching condition for the former case but the former is relatively complicated compared with the latter.

Figure 17A:
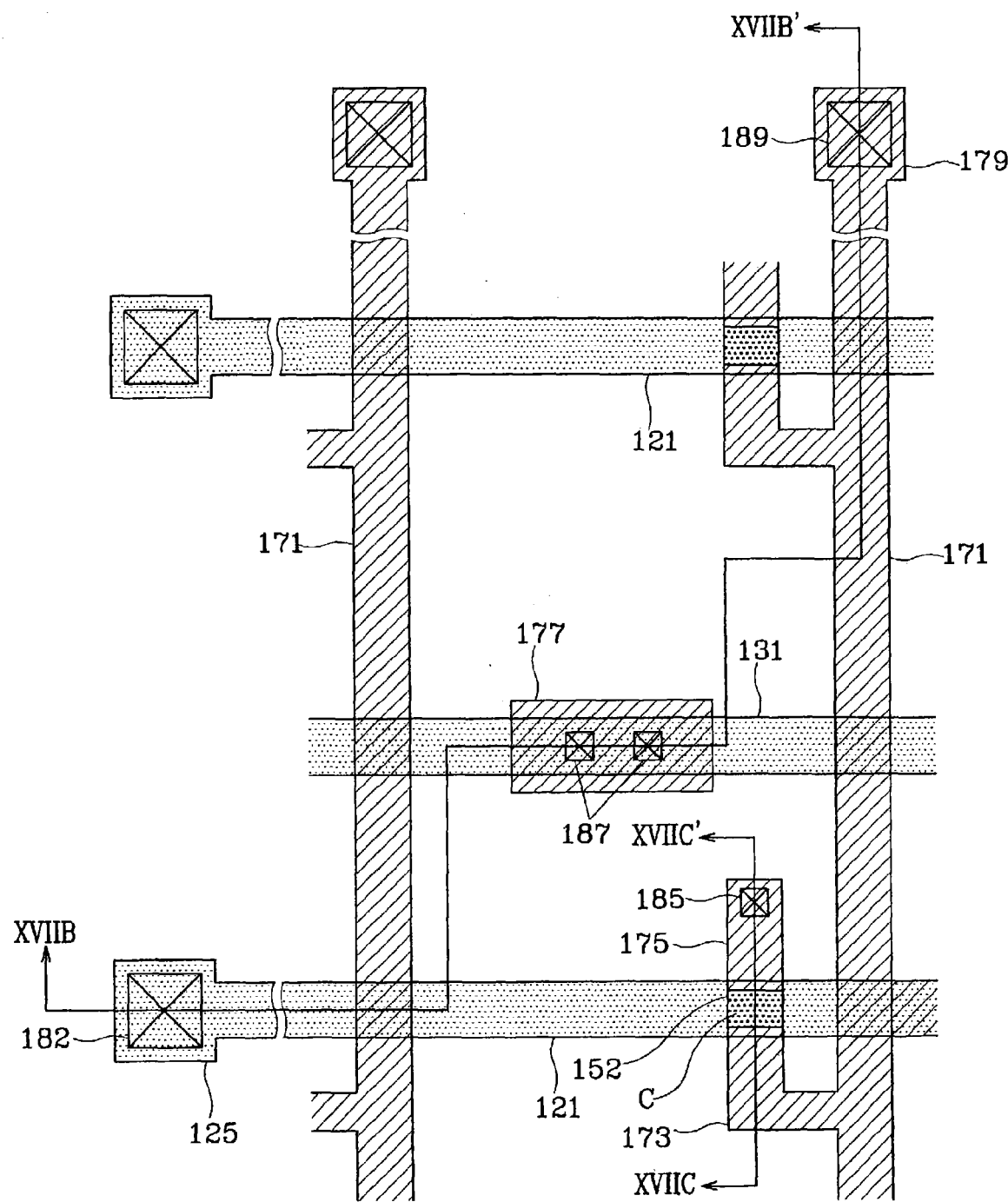
FIG. 17A is a layout view of the TFT array panel in the step following the step illustrated in FIGS. 16A and 16B.
Figure 17C:
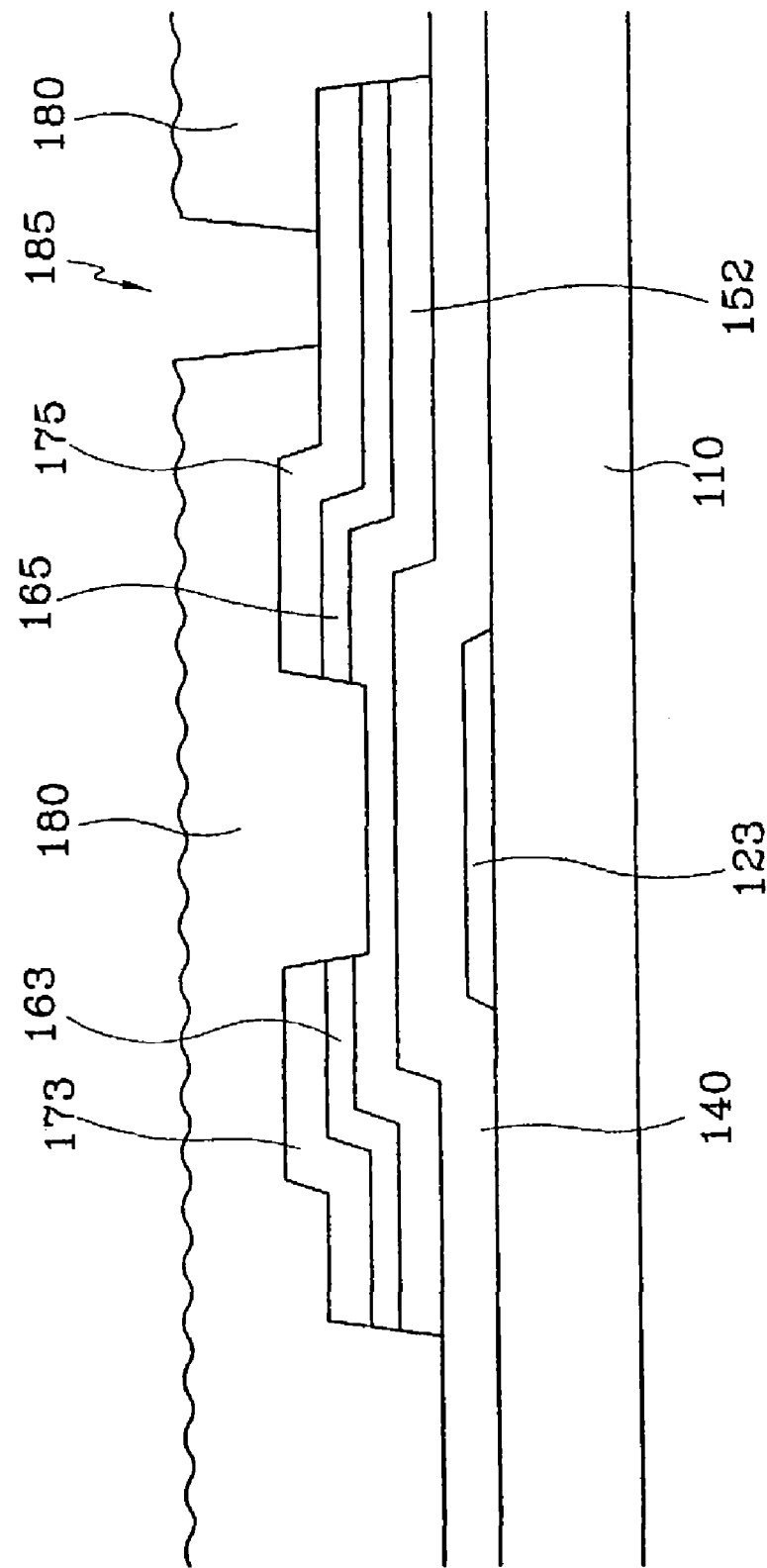
Figure 18A:
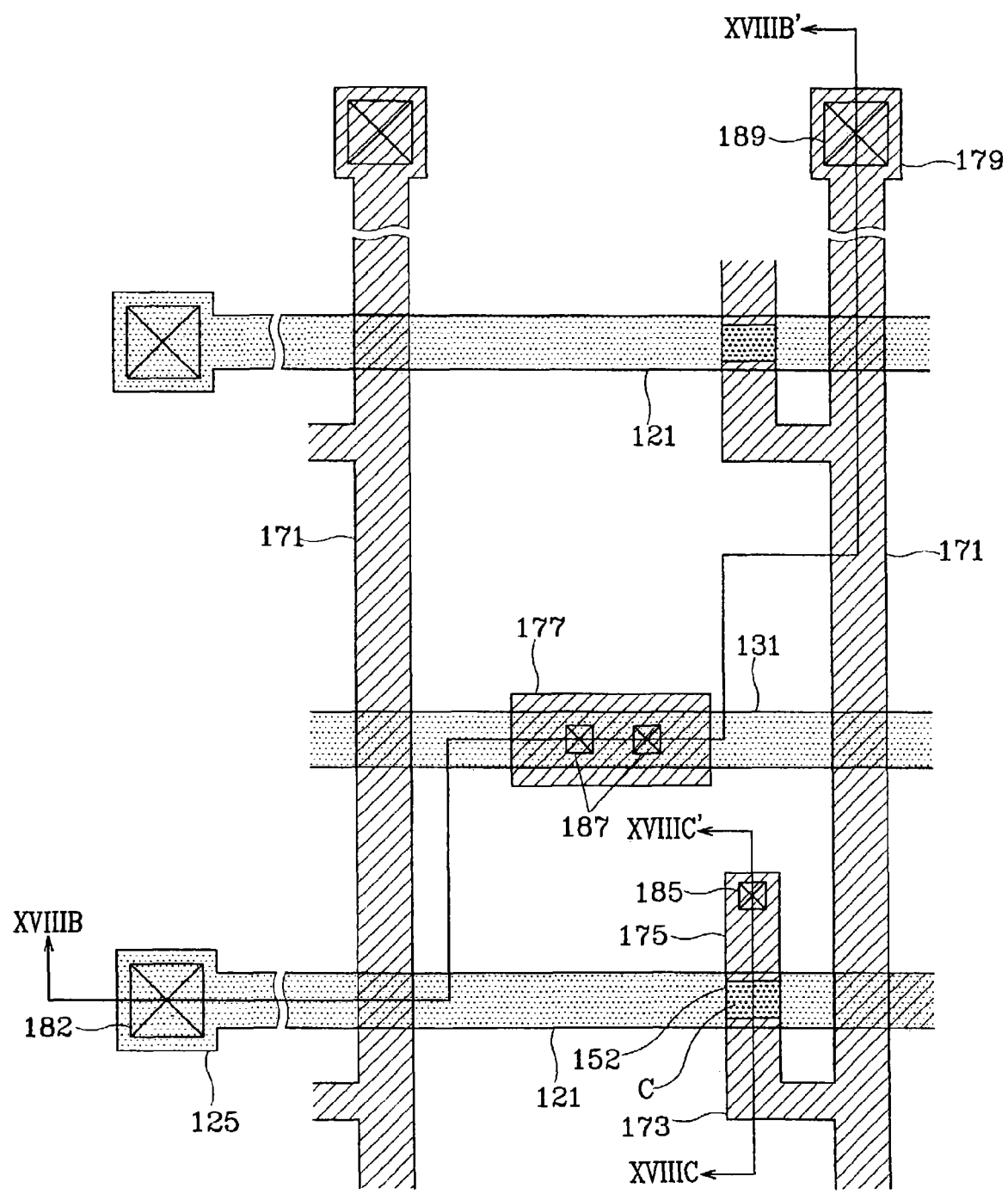
FIG. 18A is a layout view of the TFT array panel in the step following the step illustrated in FIG. 17A.
Figure 18B:
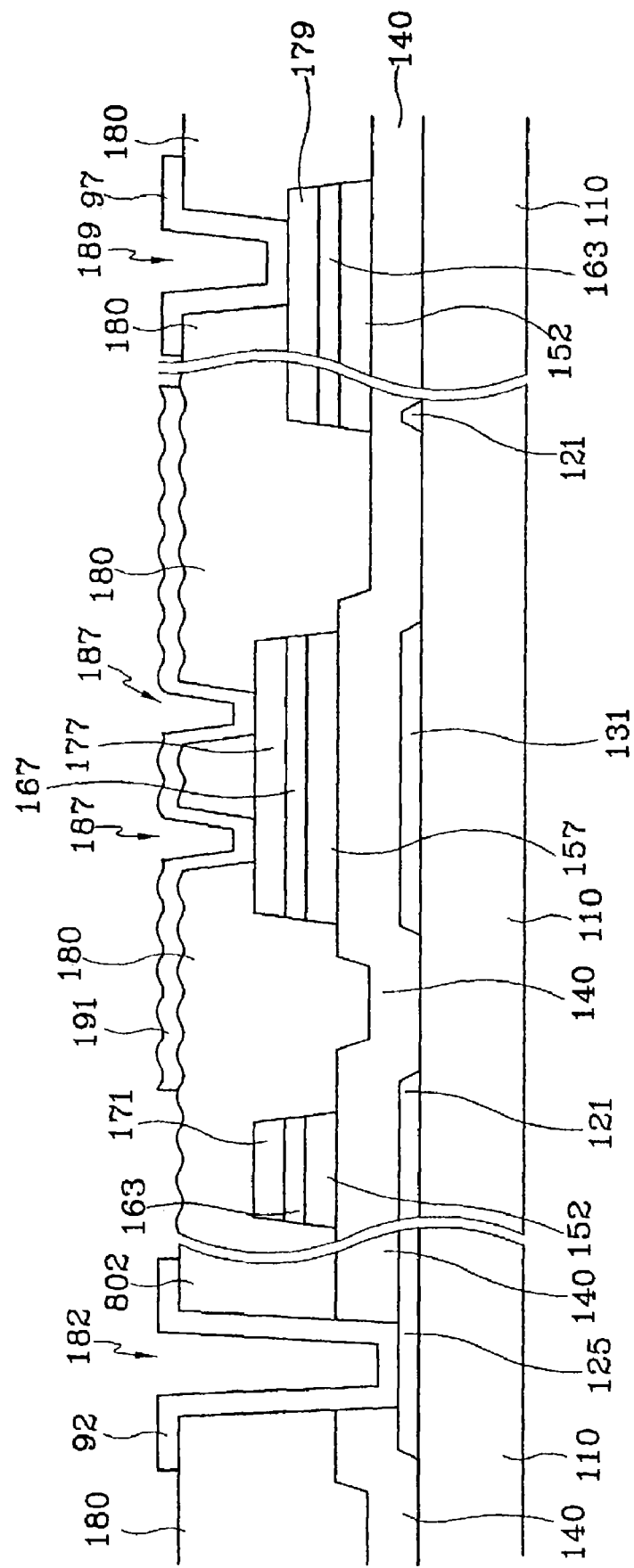

After forming the data wire 171, 173, 175, 177 and 179, a passivation layer 180 is formed by depositing inorganic insulating material or silicon nitride. As shown in FIGS. 17A to 17C, the passivation layer 180 together with the gate insulating layer 140. is etched using a mask to form a plurality of contact holes 185, 182, 189 and 187 exposing the drain electrodes 175, the gate pads 125, the data pads 179 and the storage capacitor conductors 177.

Next, IZO with 500–1,000 Å, more preferably 900 Å thickness is deposited and etched to form the transparent films 191, the subsidiary gate pads92 and the subsidiary data pads 97. The transparent films 191 are connected to the drain electrodes 175 and the storage capacitor conductors 177. The subsidiary gate pads 92 and the subsidiary data pads 97 are connected to the gate pads 125 and the data pads 179, respectively.

Finally, as shown in FIGS. 8 to 10, reflective Ag or Ag alloy and a thickness of 1,000–4,000 Å, more preferably 1,500 Å is deposited and photo-etched using a mask to form a plurality of reflective films 190 having transmissive areas T on the transparent films 191. At this time, like the first embodiment, the patterning of the reflective films 190 is preferably performed by wet etching, and the etchant preferably includes ferric nitrate in a range of 1–5%, nitric acid in a range of 1–5%, acetic acid in a range of 5–20%, hexamethylenetetramine in a range of 0.05–1% and deionized water of the remainder. Since the etchant according to the embodiment of the present invention does not corrode IZO of the transparent films 191, the patterning of the reflective films 192 may not damage the IZO films 191. It is required that the IZO films 191 maintain to have a thickness equal to or larger than 700 Å and simultaneously to secure uniform surface roughness lower than a predetermined level. In the embodiment of the present invention, the IZO films 191 are etched minutely within a range of 30 Å, the IZO films 191 can maintain 800–900 Å thickness, and also the roughness within a range of 10 Å is secured. It will be described in detail with reference to an experiment.

Since the formation of the data wire 171, 173, 175, 177 and 179, the underlying ohmic contact pattern 163, 165 and 167 and the underlying semiconductor pattern 152 and 157 as well as the separation of the source electrode 173 and the drain electrode 175 are formed using a single mask, the second embodiment of the present invention gives a simple manufacturing method as well as the advantage given by the first embodiment.

Experiment

An IZO film with 900 Å thickness was deposited and etched by an etchant for patterning a conductive layer preferably made of Ag or Ag alloy, which contains ferric nitrate, nitric acid, acetic acid, hexamethylenetetramine and deionized water. The surface of the IZO films was photographed before etching, at 30 minutes after the beginning of the etching, and at 45 minutes after the beginning of the etching.

Figure 19A:
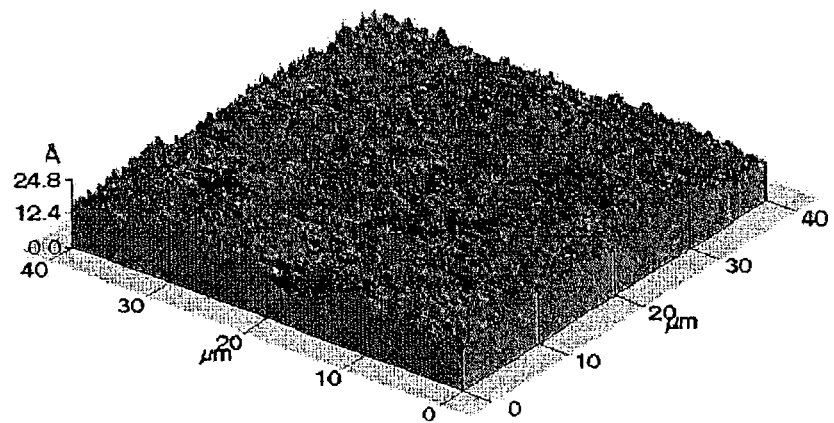
FIGS. 19A to 19C are photographs made by AFM (atomic force microscopy), which show exposed surfaces of the IZO films before and after etching the IZO films using the etchant according to the present invention.
Figure 19B:
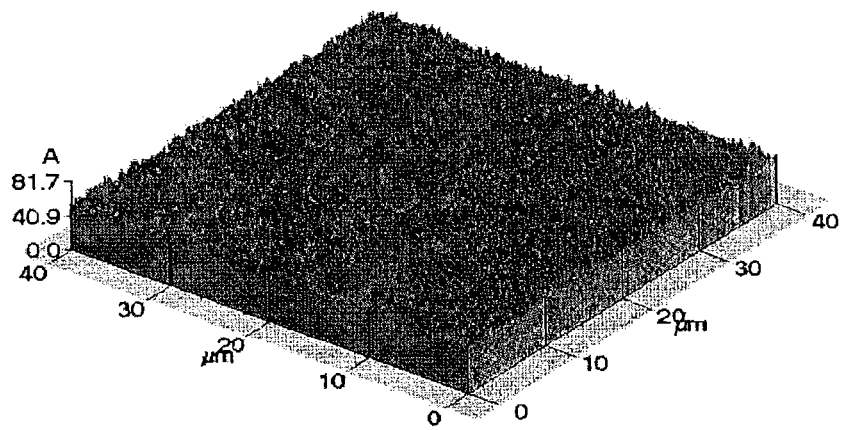
Figure 19C:
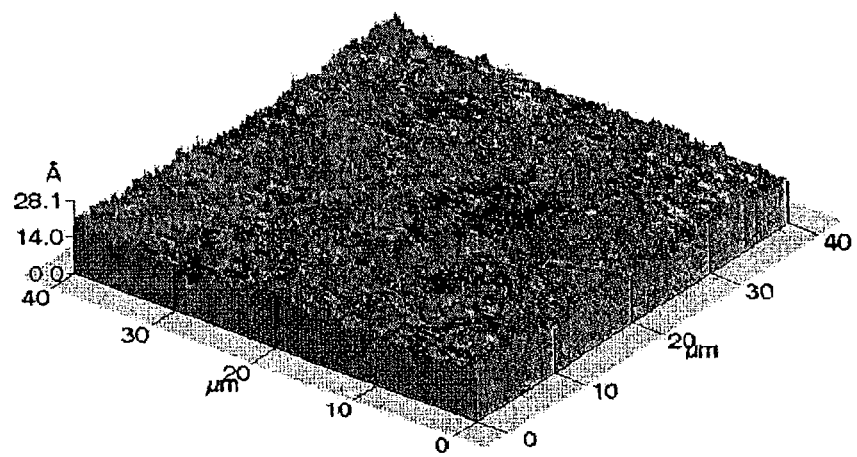

FIGS. 19A to 19C are photographs made by AFM (atomic force microscopy), which show exposed surfaces of the IZO films before and after etching the IZO films using the etchant according to the present invention. The photographs shown in FIGS. 19A–19C enlarge areas of 40×40 μm². FIG. 19A shows a film surface after deposition of an IZO film, FIG. 19B shows a film surface at 30 minutes after the start of the etching, and FIG. 19C shows a film surface at 45 minutes after the start of the etching.

As shown in FIG. 19A, the measured roughness after deposition is about 1.53 Å, and as shown in FIG. 19B, the measured roughness is as good as about 4.12 Å even though the IZO film is etched for 30 minutes using the etchant including ferric nitrate, nitric acid, acetic acid, hexamethylenetetramine and deionized water. In addition, as shown in FIG. 19C, the measured roughness becomes better as degree of 1.5 Å after etching the IZO film using the etchant during 45 minutes.

Although preferred embodiments of the present invention have been described in detail hereinabove, it should be clearly understood that many variations and/or modifications of the basic inventive concepts herein taught which may appear to those skilled in the present art will still fall within the spirit and scope of the present invention, as defined in the appended claims.

As described above, the present invention excellently patterns a conductive layer of Ag or Ag alloy using an etchant including ferric nitrate, nitric acid, acetic acid, hexamethylenetetramine, and deionized water. As a result, the conductive layer having low resistivity and high reflectance formed by using the etchant can be used as a reflective film of a TFT array panel. Furthermore, since the etchant does not erode IZO, it is possible to prevent a transparent IZO film from being damaged when patterning a reflective Ag or Ag alloy film in a manufacturing process of a TFT array panel for a transflective LCD.

What is claimed is:

1. An etchant for a wire comprising:
ferric nitrate, nitric acid, acetic acid, hexamethylenetetramine, and deionized water, wherein the etchant removes silver or silver alloys, wherein the ferric nitrate is in a range of 1–5% by weight the nitric acid is in a range of 1–5% by weight, the acetic acid is in a range of 5–20% by weight, the hexamethylenetetramine is in a range of 0.05–1% by weight, and the ionized water is the remainder.

* * * * *